(12) United States Patent
Campbell

(10) Patent No.: US 7,750,652 B2
(45) Date of Patent: Jul. 6, 2010

(54) TEST STRUCTURE AND PROBE FOR DIFFERENTIAL SIGNALS

(75) Inventor: Richard Campbell, Portland, OR (US)

(73) Assignee: Cascade Microtech, Inc., Beaverton, OR (US)

( * ) Notice: Subject to any disclaimer, the term of this patent is extended or adjusted under 35 U.S.C. 154(b) by 0 days.

(21) Appl. No.: 12/157,658

(22) Filed: Jun. 11, 2008

(65) Prior Publication Data

US 2008/0246498 A1 Oct. 9, 2008

Related U.S. Application Data

(63) Continuation of application No. 11/710,149, filed on Feb. 22, 2007, now Pat. No. 7,403,028.

(60) Provisional application No. 60/813,120, filed on Jun. 12, 2006.

(51) Int. Cl.
G01R 31/02 (2006.01)
(52) U.S. Cl. ..................................................... 324/754
(58) Field of Classification Search .............. 324/158.1, 324/750–755, 760–765; 327/103, 525; 714/724, 714/734–736
See application file for complete search history.

(56) References Cited

U.S. PATENT DOCUMENTS

| 491,783 | A | 2/1893 | Moyer |
|---|---|---|---|
| 1,337,866 | A | 4/1920 | Whitacker |
| 2,142,625 | A | 1/1939 | Zoethout |
| 2,376,101 | A | 5/1945 | Tyzzer |
| 2,389,668 | A | 11/1945 | Johnson |
| 2,545,258 | A | 3/1951 | Cailloux |
| 2,762,234 | A | 9/1956 | Dodd |
| 2,901,696 | A | 8/1959 | Möllfors |
| 2,921,276 | A | 1/1960 | Fubini |
| 2,947,939 | A | 8/1960 | Harwig |
| 3,111,699 | A | 11/1963 | Comeau |
| 3,176,091 | A | 3/1965 | Hanson, et al. |
| 3,193,712 | A | 7/1965 | Harris |
| 3,218,584 | A | 11/1965 | Ayer |
| 3,230,299 | A | 1/1966 | Radziekowski |
| 3,262,593 | A | 7/1966 | Hainer |
| 3,396,598 | A | 8/1968 | Grispo |
| 3,401,126 | A | 9/1968 | Miller et al. |
| 3,429,040 | A | 2/1969 | Miller |

(Continued)

FOREIGN PATENT DOCUMENTS

CH 607 045 11/1978

(Continued)

OTHER PUBLICATIONS

Cohn. S. "Properties of Ridge Wave Guide." Proceedings of the I.R.E., Aug. 1947. pp. 783-788.

(Continued)

*Primary Examiner*—Ha Tran T Nguyen
*Assistant Examiner*—Trung Q Nguyen
(74) *Attorney, Agent, or Firm*—Chernoff, Vilhauer, McClung & Stenzel

(57) ABSTRACT

A test structure including a differential gain cell and a differential signal probe include compensation for the Miller effect reducing the frequency dependent variability of the input impedance of the test structure.

8 Claims, 4 Drawing Sheets

U.S. PATENT DOCUMENTS

| | | |
|---|---|---|
| 3,445,770 A | 5/1969 | Harmon |
| 3,484,679 A | 12/1969 | Hodgson et al. |
| 3,541,222 A | 11/1970 | Parks et al. |
| 3,561,280 A | 2/1971 | MacPhee et al. |
| 3,573,617 A | 4/1971 | Randolph et al. |
| 3,596,228 A | 7/1971 | Reed et al. |
| 3,609,539 A | 9/1971 | Gunthert |
| 3,611,199 A | 10/1971 | Safran |
| 3,619,780 A | 11/1971 | Hoeks |
| 3,622,915 A | 11/1971 | Davo |
| 3,634,807 A | 1/1972 | Grobe et al. |
| 3,648,169 A | 3/1972 | Wiesler |
| 3,654,585 A | 4/1972 | Wickersham |
| 3,662,318 A | 5/1972 | Decuyper |
| 3,680,037 A | 7/1972 | Nellis et al. |
| 3,686,624 A | 8/1972 | Napoli et al. |
| 3,700,998 A | 10/1972 | Lee et al. |
| 3,705,379 A | 12/1972 | Bogar |
| 3,710,251 A | 1/1973 | Hagge et al. |
| 3,714,572 A | 1/1973 | Ham et al. |
| 3,725,829 A | 4/1973 | Brown |
| 3,740,900 A | 6/1973 | Youmans et al. |
| 3,766,470 A | 10/1973 | Hay et al. |
| 3,803,709 A | 4/1974 | Beltz et al. |
| 3,806,801 A | 4/1974 | Bove |
| 3,810,016 A | 5/1974 | Chayka et al. |
| 3,829,076 A | 8/1974 | Sofy |
| 3,833,852 A | 9/1974 | Schoch |
| 3,839,672 A | 10/1974 | Anderson |
| 3,849,728 A | 11/1974 | Evans |
| 3,858,212 A | 12/1974 | Tompkins et al. |
| 3,862,790 A | 1/1975 | Davies et al. |
| 3,866,093 A | 2/1975 | Kusters et al. |
| 3,867,698 A | 2/1975 | Beltz et al. |
| 3,882,597 A | 5/1975 | Chayka, et al. |
| 3,930,809 A | 1/1976 | Evans |
| 3,936,743 A | 2/1976 | Roch |
| 3,952,156 A | 4/1976 | Lahr |
| 3,970,934 A | 7/1976 | Aksu |
| 3,971,610 A | 7/1976 | Buchoff et al. |
| 3,976,959 A | 8/1976 | Gaspari |
| 3,992,073 A | 11/1976 | Buchoff et al. |
| 4,001,685 A | 1/1977 | Roch |
| 4,008,900 A | 2/1977 | Khoshaba |
| 4,009,456 A | 2/1977 | Hopfer |
| 4,027,935 A | 6/1977 | Byrnes et al. |
| 4,035,723 A | 7/1977 | Kvaternik |
| 4,038,599 A | 7/1977 | Bove et al. |
| 4,038,894 A | 8/1977 | Knibbe et al. |
| 4,049,252 A | 9/1977 | Bell |
| 4,063,195 A | 12/1977 | Abrams et al. |
| 4,066,943 A | 1/1978 | Roch |
| 4,072,576 A | 2/1978 | Arwin et al. |
| 4,074,201 A | 2/1978 | Lennon |
| 4,093,988 A | 6/1978 | Scott |
| 4,099,120 A | 7/1978 | Aksu |
| 4,115,735 A | 9/1978 | Stanford |
| 4,116,523 A | 9/1978 | Coberly |
| 4,123,706 A | 10/1978 | Roch |
| 4,124,787 A | 11/1978 | Aamoth et al. |
| 4,135,131 A | 1/1979 | Larsen et al. |
| 4,151,465 A | 4/1979 | Lenz |
| 4,161,692 A | 7/1979 | Tarzwell |
| 4,177,421 A | 12/1979 | Thornburg |
| 4,184,133 A | 1/1980 | Gehle |
| 4,184,729 A | 1/1980 | Parks et al. |
| 4,216,467 A | 8/1980 | Colston |
| 4,225,819 A | 9/1980 | Grau et al. |
| 4,232,398 A | 11/1980 | Gould et al. |
| 4,251,772 A | 2/1981 | Worsham et al. |
| 4,275,446 A | 6/1981 | Blaess |
| 4,277,741 A | 7/1981 | Faxvog et al. |
| 4,280,112 A | 7/1981 | Eisenhart |
| 4,284,033 A | 8/1981 | del Rio |
| 4,284,682 A | 8/1981 | Tshrich et al. |
| 4,287,473 A | 9/1981 | Sawyer |
| 4,302,146 A | 11/1981 | Finlayson et al. |
| 4,306,235 A | 12/1981 | Christmann |
| 4,312,117 A | 1/1982 | Robillard et al. |
| 4,327,180 A | 4/1982 | Chen |
| 4,330,783 A | 5/1982 | Toia |
| 4,340,860 A | 7/1982 | Teeple, Jr. |
| 4,346,355 A | 8/1982 | Tsukii |
| 4,357,575 A | 11/1982 | Uren et al. |
| 4,375,631 A | 3/1983 | Goldberg |
| 4,376,920 A | 3/1983 | Smith |
| 4,383,217 A | 5/1983 | Shiell |
| 4,401,945 A | 8/1983 | Juengel |
| 4,425,395 A | 1/1984 | Negishi et al. |
| 4,453,142 A | 6/1984 | Murphy |
| 4,468,629 A | 8/1984 | Choma, Jr. |
| 4,476,363 A | 10/1984 | Berggren et al. |
| 4,480,223 A | 10/1984 | Aigo |
| 4,487,996 A | 12/1984 | Rabinowitz et al. |
| 4,491,783 A | 1/1985 | Sawayama et al. |
| 4,502,028 A | 2/1985 | Leake |
| 4,515,133 A | 5/1985 | Roman |
| 4,515,439 A | 5/1985 | Esswein |
| 4,520,314 A | 5/1985 | Asch et al. |
| 4,528,504 A | 7/1985 | Thornton, Jr. et al. |
| 4,531,474 A | 7/1985 | Inuta |
| 4,551,747 A | 11/1985 | Gilbert et al. |
| 4,552,033 A | 11/1985 | Marzhauser |
| 4,553,111 A | 11/1985 | Barrow |
| 4,558,609 A | 12/1985 | Kim |
| 4,563,640 A | 1/1986 | Hasegawa |
| 4,567,321 A | 1/1986 | Harayama |
| 4,567,436 A | 1/1986 | Koch |
| 4,568,890 A | 2/1986 | Bates |
| 4,581,679 A | 4/1986 | Smolley |
| 4,588,950 A | 5/1986 | Henley |
| 4,589,815 A | 5/1986 | Smith |
| 4,593,243 A | 6/1986 | Lao et al. |
| 4,600,907 A | 7/1986 | Grellman et al. |
| 4,621,169 A | 11/1986 | Petinelli et al. |
| 4,626,618 A | 12/1986 | Takaoka et al. |
| 4,626,805 A | 12/1986 | Jones |
| 4,636,722 A | 1/1987 | Ardezzone |
| 4,636,772 A | 1/1987 | Yasunaga |
| 4,641,659 A | 2/1987 | Sepponen |
| 4,642,417 A | 2/1987 | Ruthrof et al. |
| 4,646,005 A | 2/1987 | Ryan |
| 4,649,339 A | 3/1987 | Grangroth et al. |
| 4,651,115 A | 3/1987 | Wu |
| 4,652,082 A | 3/1987 | Warner |
| 4,653,174 A | 3/1987 | Gilder, Jr. et al. |
| 4,663,840 A | 5/1987 | Ubbens et al. |
| 4,669,805 A | 6/1987 | Kosugi et al. |
| 4,673,839 A | 6/1987 | Veenendaal |
| 4,684,883 A | 8/1987 | Ackerman et al. |
| 4,684,884 A | 8/1987 | Soderlund |
| 4,685,150 A | 8/1987 | Maier |
| 4,691,163 A | 9/1987 | Blass et al. |
| 4,696,544 A | 9/1987 | Costella |
| 4,697,143 A | 9/1987 | Lockwood et al. |
| 4,705,447 A | 11/1987 | Smith |
| 4,706,050 A | 11/1987 | Andrews |
| 4,707,657 A | 11/1987 | Bøegh-Petersen |
| 4,711,563 A | 12/1987 | Lass |
| 4,713,347 A | 12/1987 | Mitchell et al. |
| 4,714,873 A | 12/1987 | McPherson et al. |
| 4,725,793 A | 2/1988 | Igarashi |
| 4,727,319 A | 2/1988 | Shahriary |
| 4,727,391 A | 2/1988 | Tajima et al. |

| Patent | Date | Inventor |
|---|---|---|
| 4,727,637 A | 3/1988 | Buckwitz et al. |
| 4,734,641 A | 3/1988 | Byrd, Jr. et al. |
| 4,739,259 A | 4/1988 | Hadwin et al. |
| 4,740,764 A | 4/1988 | Gerlack |
| 4,742,571 A | 5/1988 | Letron |
| 4,744,041 A | 5/1988 | Strunk et al. |
| 4,746,857 A | 5/1988 | Sakai et al. |
| 4,749,942 A | 6/1988 | Sang et al. |
| 4,754,239 A | 6/1988 | Sedivec |
| 4,755,742 A | 7/1988 | Mallory et al. |
| 4,755,746 A | 7/1988 | Mallory et al. |
| 4,755,747 A | 7/1988 | Sato |
| 4,755,872 A | 7/1988 | Esrig et al. |
| 4,755,874 A | 7/1988 | Esrig et al. |
| 4,757,255 A | 7/1988 | Margozzi |
| 4,764,723 A | 8/1988 | Strid |
| 4,766,384 A | 8/1988 | Kleinberg et al. |
| 4,772,846 A | 9/1988 | Reeds |
| 4,780,670 A | 10/1988 | Cherry |
| 4,783,625 A | 11/1988 | Harry et al. |
| 4,788,851 A | 12/1988 | Brault |
| 4,791,363 A | 12/1988 | Logan |
| 4,793,814 A | 12/1988 | Zifcak et al. |
| 4,795,962 A | 1/1989 | Yanagawa et al. |
| 4,805,627 A | 2/1989 | Klingenbeck et al. |
| 4,810,981 A | 3/1989 | Herstein |
| 4,812,754 A | 3/1989 | Tracy et al. |
| 4,818,059 A | 4/1989 | Kakii et al. |
| 4,827,211 A | 5/1989 | Strid et al. |
| 4,831,494 A | 5/1989 | Arnold et al. |
| 4,835,495 A | 5/1989 | Simonutti |
| 4,837,507 A | 6/1989 | Hechtman |
| 4,839,587 A | 6/1989 | Flatley et al. |
| 4,849,689 A | 7/1989 | Gleason et al. |
| 4,851,767 A | 7/1989 | Halbout et al. |
| 4,853,624 A | 8/1989 | Rabjohn |
| 4,853,627 A | 8/1989 | Gleason et al. |
| 4,858,160 A | 8/1989 | Strid et al. |
| 4,859,989 A | 8/1989 | McPherson |
| 4,864,227 A | 9/1989 | Sato |
| 4,871,883 A | 10/1989 | Guiol |
| 4,871,964 A | 10/1989 | Boll et al. |
| 4,888,550 A | 12/1989 | Reid |
| 4,891,584 A | 1/1990 | Kamieniecki et al. |
| 4,893,914 A | 1/1990 | Hancock et al. |
| 4,894,612 A | 1/1990 | Drake et al. |
| 4,899,126 A | 2/1990 | Yamada |
| 4,899,998 A | 2/1990 | Feramachi |
| 4,901,012 A | 2/1990 | Gloanec et al. |
| 4,904,933 A | 2/1990 | Snyder et al. |
| 4,904,935 A | 2/1990 | Calma et al. |
| 4,906,920 A | 3/1990 | Huff et al. |
| 4,908,570 A | 3/1990 | Gupta et al. |
| 4,912,399 A | 3/1990 | Greub et al. |
| 4,916,002 A | 4/1990 | Carver |
| 4,916,398 A | 4/1990 | Rath |
| 4,918,373 A | 4/1990 | Newberg |
| 4,918,383 A | 4/1990 | Huff et al. |
| 4,922,128 A | 5/1990 | Dhong et al. |
| 4,922,186 A | 5/1990 | Tsuchiya et al. |
| 4,922,912 A | 5/1990 | Watanabe |
| 4,926,172 A | 5/1990 | Gorsek |
| 4,929,893 A | 5/1990 | Sato et al. |
| 4,965,514 A | 10/1990 | Herrick |
| 4,970,386 A | 11/1990 | Buck |
| 4,972,073 A | 11/1990 | Lessing |
| 4,975,638 A | 12/1990 | Evans et al. |
| 4,980,637 A | 12/1990 | Huff et al. |
| 4,980,638 A | 12/1990 | Dermon et al. |
| 4,983,910 A | 1/1991 | Majidi-Ahy et al. |
| 4,987,100 A | 1/1991 | McBride et al. |
| 4,988,062 A | 1/1991 | London |
| 4,991,290 A | 2/1991 | MacKay |
| 4,998,062 A | 3/1991 | Ikeda |
| 4,998,063 A | 3/1991 | Miller |
| 5,001,423 A | 3/1991 | Abrami et al. |
| 5,003,253 A | 3/1991 | Majidi-Ahy et al. |
| 5,007,163 A | 4/1991 | Pope et al. |
| 5,012,186 A | 4/1991 | Gleason |
| 5,020,219 A | 6/1991 | Leedy |
| 5,021,186 A | 6/1991 | Ota et al. |
| 5,030,907 A | 7/1991 | Yih et al. |
| 5,041,782 A | 8/1991 | Marzan |
| 5,045,781 A | 9/1991 | Gleason et al. |
| 5,059,898 A | 10/1991 | Barsotti et al. |
| 5,061,192 A | 10/1991 | Chapin et al. |
| 5,061,823 A | 10/1991 | Carroll |
| 5,066,357 A | 11/1991 | Smyth, Jr. et al. |
| 5,069,628 A | 12/1991 | Crumly |
| 5,082,627 A | 1/1992 | Stanbro |
| 5,084,671 A | 1/1992 | Miyata et al. |
| 5,089,774 A | 2/1992 | Nakano |
| 5,091,692 A | 2/1992 | Ohno et al. |
| 5,091,732 A | 2/1992 | Mileski et al. |
| 5,095,891 A | 3/1992 | Reitter |
| 5,097,101 A | 3/1992 | Trobough |
| 5,097,207 A | 3/1992 | Blanz |
| 5,101,453 A | 3/1992 | Rumbaugh |
| 5,107,076 A | 4/1992 | Bullock et al. |
| 5,116,180 A | 5/1992 | Fung et al. |
| 5,126,286 A | 6/1992 | Chance |
| 5,126,696 A | 6/1992 | Grote et al. |
| 5,128,612 A | 7/1992 | Aton et al. |
| 5,129,006 A | 7/1992 | Hill et al. |
| 5,133,119 A | 7/1992 | Afshari et al. |
| 5,134,365 A | 7/1992 | Okubo et al. |
| 5,136,237 A | 8/1992 | Smith et al. |
| 5,138,289 A | 8/1992 | McGrath |
| 5,142,224 A | 8/1992 | Smith et al. |
| 5,145,552 A | 9/1992 | Yoshizawa et al. |
| 5,148,131 A | 9/1992 | Amboss et al. |
| 5,159,264 A | 10/1992 | Anderson |
| 5,159,267 A | 10/1992 | Anderson |
| 5,159,752 A | 11/1992 | Mahant-Shetti et al. |
| 5,160,883 A | 11/1992 | Blanz |
| 5,164,319 A | 11/1992 | Hafeman et al. |
| 5,166,606 A | 11/1992 | Blanz |
| 5,170,930 A | 12/1992 | Dolbear et al. |
| 5,172,049 A | 12/1992 | Kiyokawa et al. |
| 5,172,050 A | 12/1992 | Swapp |
| 5,172,051 A | 12/1992 | Zamborelli |
| 5,177,438 A | 1/1993 | Littlebury et al. |
| 5,180,977 A | 1/1993 | Huff |
| 5,187,443 A | 2/1993 | Bereskin |
| 5,198,752 A | 3/1993 | Miyata et al. |
| 5,198,753 A | 3/1993 | Hamburgen |
| 5,202,558 A | 4/1993 | Barker |
| 5,202,648 A | 4/1993 | McCandless |
| 5,207,585 A | 5/1993 | Byrnes et al. |
| 5,214,243 A | 5/1993 | Johnson |
| 5,214,374 A | 5/1993 | St. Onge |
| 5,225,037 A | 7/1993 | Elder et al. |
| 5,227,730 A | 7/1993 | King et al. |
| 5,232,789 A | 8/1993 | Platz et al. |
| 5,233,197 A | 8/1993 | Bowman et al. |
| 5,233,306 A | 8/1993 | Misra |
| 5,245,292 A | 9/1993 | Milesky et al. |
| 5,266,889 A | 11/1993 | Harwood et al. |
| 5,266,963 A | 11/1993 | Carter |
| 5,267,088 A | 11/1993 | Nomura |
| 5,270,664 A | 12/1993 | McMurtry et al. |
| 5,274,336 A | 12/1993 | Crook et al. |
| 5,280,156 A | 1/1994 | Niori et al. |
| 5,281,364 A | 1/1994 | Stirling et al. |
| 5,289,117 A | 2/1994 | Van Loan et al. |
| 5,293,175 A | 3/1994 | Hemmie et al. |

| | | | | | |
|---|---|---|---|---|---|
| 5,298,972 A | 3/1994 | Heffner | 5,539,323 A | 7/1996 | Davis, Jr. |
| 5,304,924 A | 4/1994 | Yamano et al. | 5,539,676 A | 7/1996 | Yamaguchi |
| 5,308,250 A | 5/1994 | Walz | 5,550,481 A | 8/1996 | Holmes et al. |
| 5,313,157 A | 5/1994 | Pasiecznik, Jr. | 5,561,378 A | 10/1996 | Bockelman et al. |
| 5,315,237 A | 5/1994 | Iwakura et al. | 5,565,788 A | 10/1996 | Burr et al. |
| 5,316,435 A | 5/1994 | Mozingo | 5,565,881 A | 10/1996 | Phillips et al. |
| 5,317,656 A | 5/1994 | Moslehi et al. | 5,569,591 A | 10/1996 | Kell et al. |
| 5,321,352 A | 6/1994 | Takebuchi | 5,571,324 A | 11/1996 | Sago et al. |
| 5,321,453 A | 6/1994 | Mori et al. | 5,578,932 A | 11/1996 | Adamian |
| 5,326,412 A | 7/1994 | Schreiber et al. | 5,583,445 A | 12/1996 | Mullen |
| 5,334,931 A | 8/1994 | Clarke et al. | 5,584,120 A | 12/1996 | Roberts |
| 5,347,204 A | 9/1994 | Gregory et al. | 5,584,608 A | 12/1996 | Gillespie |
| 5,355,079 A | 10/1994 | Evans et al. | 5,589,781 A | 12/1996 | Higgens et al. |
| 5,357,211 A | 10/1994 | Bryson et al. | 5,594,358 A | 1/1997 | Ishikawa et al. |
| 5,360,312 A | 11/1994 | Mozingo | 5,600,256 A | 2/1997 | Woith et al. |
| 5,361,049 A | 11/1994 | Rubin et al. | 5,601,740 A | 2/1997 | Eldridge et al. |
| 5,363,050 A | 11/1994 | Guo et al. | 5,610,529 A | 3/1997 | Schwindt |
| 5,367,165 A | 11/1994 | Toda et al. | 5,611,008 A | 3/1997 | Yap |
| 5,369,368 A | 11/1994 | Kassen et al. | 5,617,035 A | 4/1997 | Swapp |
| 5,371,654 A | 12/1994 | Beaman et al. | 5,621,333 A | 4/1997 | Long et al. |
| 5,373,231 A | 12/1994 | Boll et al. | 5,621,400 A | 4/1997 | Corbi |
| 5,374,938 A | 12/1994 | Hatazawa et al. | 5,623,213 A | 4/1997 | Liu et al. |
| 5,376,790 A | 12/1994 | Linker et al. | 5,623,214 A | 4/1997 | Pasiecznik, Jr. |
| 5,383,787 A | 1/1995 | Switky et al. | 5,627,473 A | 5/1997 | Takami |
| 5,389,885 A | 2/1995 | Swart | 5,628,057 A | 5/1997 | Phillips et al. |
| 5,395,253 A | 3/1995 | Crumly | 5,629,838 A | 5/1997 | Knight et al. |
| 5,397,855 A | 3/1995 | Ferlier | 5,631,571 A | 5/1997 | Spaziani et al. |
| 5,404,111 A | 4/1995 | Mori et al. | 5,633,780 A | 5/1997 | Cronin |
| 5,408,188 A | 4/1995 | Katoh | 5,635,846 A | 6/1997 | Beaman et al. |
| 5,408,189 A | 4/1995 | Swart et al. | 5,642,298 A | 6/1997 | Mallory et al. |
| 5,412,330 A | 5/1995 | Ravel et al. | 5,644,248 A | 7/1997 | Fujimoto |
| 5,412,866 A | 5/1995 | Woith et al. | 5,653,939 A | 8/1997 | Hollis et al. |
| 5,414,565 A | 5/1995 | Sullivan et al. | 5,656,942 A | 8/1997 | Watts et al. |
| 5,422,574 A | 6/1995 | Kister | 5,659,421 A | 8/1997 | Rahmel et al. |
| 5,430,813 A | 7/1995 | Anderson et al. | 5,666,063 A | 9/1997 | Abercrombie et al. |
| 5,441,690 A | 8/1995 | Ayala-Esquilin et al. | 5,669,316 A | 9/1997 | Faz et al. |
| 5,451,884 A | 9/1995 | Sauerland | 5,670,322 A | 9/1997 | Eggers et al. |
| 5,453,404 A | 9/1995 | Leedy | 5,670,888 A | 9/1997 | Cheng |
| 5,457,398 A | 10/1995 | Schwindt et al. | 5,672,816 A | 9/1997 | Park et al. |
| 5,463,324 A | 10/1995 | Wardwell et al. | 5,675,499 A | 10/1997 | Lee et al. |
| 5,467,024 A | 11/1995 | Swapp | 5,675,932 A | 10/1997 | Mauney |
| 5,469,324 A | 11/1995 | Henderson et al. | 5,676,360 A | 10/1997 | Boucher et al. |
| 5,471,185 A | 11/1995 | Shea et al. | 5,678,210 A | 10/1997 | Hannah |
| 5,475,316 A | 12/1995 | Hurley et al. | 5,685,232 A | 11/1997 | Inoue |
| 5,476,211 A | 12/1995 | Khandros | 5,686,317 A | 11/1997 | Akram et al. |
| 5,477,011 A | 12/1995 | Singles et al. | 5,686,960 A | 11/1997 | Sussman et al. |
| 5,478,748 A | 12/1995 | Akins, Jr. et al. | 5,688,618 A | 11/1997 | Hulderman et al. |
| 5,479,108 A | 12/1995 | Cheng | 5,700,844 A | 12/1997 | Hedrick et al. |
| 5,479,109 A | 12/1995 | Lau et al. | 5,704,355 A | 1/1998 | Bridges |
| 5,481,196 A | 1/1996 | Nosov | 5,715,819 A | 2/1998 | Svenson et al. |
| 5,481,936 A | 1/1996 | Yanagisawa | 5,720,098 A | 2/1998 | Kister |
| 5,487,999 A | 1/1996 | Farnworth | 5,723,347 A | 3/1998 | Kirano et al. |
| 5,488,954 A | 2/1996 | Sleva et al. | 5,726,211 A | 3/1998 | Hedrick et al. |
| 5,491,425 A | 2/1996 | Watanabe et al. | 5,728,091 A | 3/1998 | Payne et al. |
| 5,493,070 A | 2/1996 | Habu | 5,729,150 A | 3/1998 | Schwindt |
| 5,493,236 A | 2/1996 | Ishii et al. | 5,731,920 A | 3/1998 | Katsuragawa |
| 5,500,606 A | 3/1996 | Holmes | 5,742,174 A | 4/1998 | Kister et al. |
| 5,505,150 A | 4/1996 | James et al. | 5,744,971 A | 4/1998 | Chan et al. |
| 5,506,498 A | 4/1996 | Anderson et al. | 5,748,506 A | 5/1998 | Bockelman |
| 5,506,515 A | 4/1996 | Godshalk et al. | 5,751,153 A | 5/1998 | Bockelman |
| 5,507,652 A | 4/1996 | Wardwell | 5,751,252 A | 5/1998 | Phillips |
| 5,510,792 A | 4/1996 | Ono et al. | 5,756,021 A | 5/1998 | Bedrick et al. |
| 5,511,010 A | 4/1996 | Burns | 5,756,908 A | 5/1998 | Knollmeyer et al. |
| 5,512,835 A | 4/1996 | Rivera et al. | 5,764,070 A | 6/1998 | Pedder |
| 5,517,126 A | 5/1996 | Yamaguchi | 5,767,690 A | 6/1998 | Fujimoto |
| 5,521,518 A | 5/1996 | Higgins | 5,772,451 A | 6/1998 | Dozier, II et al. |
| 5,521,522 A | 5/1996 | Abe et al. | 5,773,780 A | 6/1998 | Eldridge et al. |
| 5,523,694 A | 6/1996 | Cole, Jr. | 5,777,485 A | 7/1998 | Tanaka et al. |
| 5,528,158 A | 6/1996 | Sinsheimer et al. | 5,785,538 A | 7/1998 | Beaman et al. |
| 5,530,372 A | 6/1996 | Lee et al. | 5,792,668 A | 8/1998 | Fuller et al. |
| 5,531,022 A | 7/1996 | Beaman et al. | 5,793,213 A | 8/1998 | Bockelman et al. |
| 5,532,608 A | 7/1996 | Behfar-Rad et al. | 5,794,133 A | 8/1998 | Kashima |
| 5,537,372 A | 7/1996 | Albrecht et al. | 5,803,607 A | 9/1998 | Jones et al. |

| | | | | | |
|---|---|---|---|---|---|
| 5,804,607 A | 9/1998 | Hedrick et al. | 5,996,102 A | 11/1999 | Haulin |
| 5,804,982 A | 9/1998 | Lo et al. | 5,998,228 A | 12/1999 | Eldridge et al. |
| 5,804,983 A | 9/1998 | Nakajima et al. | 5,998,768 A | 12/1999 | Hunter et al. |
| 5,806,181 A | 9/1998 | Khandros et al. | 5,998,864 A | 12/1999 | Khandros et al. |
| 5,807,107 A | 9/1998 | Bright et al. | 5,999,268 A | 12/1999 | Yonezawa et al. |
| 5,808,874 A | 9/1998 | Smith | 6,001,760 A | 12/1999 | Katsuda et al. |
| 5,810,607 A | 9/1998 | Shih et al. | 6,002,426 A | 12/1999 | Back et al. |
| 5,811,751 A | 9/1998 | Leona et al. | 6,006,002 A | 12/1999 | Motok et al. |
| 5,811,982 A | 9/1998 | Beaman et al. | 6,013,586 A | 1/2000 | McGhee et al. |
| 5,813,847 A | 9/1998 | Eroglu et al. | 6,019,612 A | 2/2000 | Hasegawa et al. |
| 5,814,847 A | 9/1998 | Shihadeh et al. | 6,023,103 A | 2/2000 | Chang et al. |
| 5,820,014 A | 10/1998 | Dozier, II et al. | 6,028,435 A | 2/2000 | Nikawa |
| 5,821,763 A | 10/1998 | Beaman et al. | 6,029,344 A | 2/2000 | Khandros et al. |
| 5,824,494 A | 10/1998 | Feldberg | 6,031,383 A | 2/2000 | Streib et al. |
| 5,829,128 A | 11/1998 | Eldridge et al. | 6,032,356 A | 3/2000 | Eldridge et al. |
| 5,829,437 A | 11/1998 | Bridges | 6,032,714 A | 3/2000 | Fenton |
| 5,831,442 A | 11/1998 | Heigl | 6,033,935 A | 3/2000 | Dozier, II et al. |
| 5,832,601 A | 11/1998 | Eldridge et al. | 6,034,533 A | 3/2000 | Tervo et al. |
| 5,833,601 A | 11/1998 | Swartz et al. | 6,037,785 A | 3/2000 | Higgins |
| 5,838,160 A | 11/1998 | Beaman et al. | 6,040,739 A | 3/2000 | Wedeen et al. |
| 5,841,288 A | 11/1998 | Meaney et al. | 6,042,712 A | 3/2000 | Mathieu |
| 5,841,342 A | 11/1998 | Hegmann et al. | 6,043,563 A | 3/2000 | Eldridge et al. |
| 5,846,708 A | 12/1998 | Hollis et al. | 6,046,599 A | 4/2000 | Long et al. |
| 5,847,569 A | 12/1998 | Ho et al. | 6,049,216 A | 4/2000 | Yang et al. |
| 5,848,500 A | 12/1998 | Kirk | 6,049,976 A | 4/2000 | Khandros |
| 5,852,232 A | 12/1998 | Samsavar et al. | 6,050,829 A | 4/2000 | Eldridge et al. |
| 5,852,871 A | 12/1998 | Khandros | 6,051,422 A | 4/2000 | Kovacs et al. |
| 5,854,608 A | 12/1998 | Leisten | 6,052,653 A | 4/2000 | Mazur et al. |
| 5,864,946 A | 2/1999 | Eldridge et al. | 6,054,651 A | 4/2000 | Fogel et al. |
| 5,867,073 A | 2/1999 | Weinreb et al. | 6,054,869 A | 4/2000 | Hutton et al. |
| 5,869,326 A | 2/1999 | Hofmann | 6,059,982 A | 5/2000 | Palagonia et al. |
| 5,869,974 A | 2/1999 | Akram et al. | 6,060,888 A | 5/2000 | Blackham et al. |
| 5,874,361 A | 2/1999 | Collins et al. | 6,060,892 A | 5/2000 | Yamagata |
| 5,876,082 A | 3/1999 | Kempf et al. | 6,061,589 A | 5/2000 | Bridges et al. |
| 5,878,486 A | 3/1999 | Eldridge et al. | 6,062,879 A | 5/2000 | Beaman et al. |
| 5,879,289 A | 3/1999 | Yarush et al. | 6,064,213 A | 5/2000 | Khandros et al. |
| 5,883,522 A | 3/1999 | O'Boyle | 6,064,217 A | 5/2000 | Smith |
| 5,883,523 A | 3/1999 | Ferland et al. | 6,064,218 A | 5/2000 | Godfrey et al. |
| 5,884,398 A | 3/1999 | Eldridge et al. | 6,066,911 A | 5/2000 | Lindemann et al. |
| 5,888,075 A | 3/1999 | Hasegawa et al. | 6,071,009 A | 6/2000 | Clyne |
| 5,892,539 A | 4/1999 | Colvin | 6,078,183 A | 6/2000 | Cole, Jr. |
| 5,896,038 A | 4/1999 | Budnaitis et al. | 6,078,500 A | 6/2000 | Beaman et al. |
| 5,900,737 A | 5/1999 | Graham et al. | 6,090,261 A | 7/2000 | Mathieu |
| 5,900,738 A | 5/1999 | Khandros et al. | 6,091,236 A | 7/2000 | Piety et al. |
| 5,903,143 A | 5/1999 | Mochizuki et al. | 6,091,255 A | 7/2000 | Godfrey |
| 5,905,421 A | 5/1999 | Oldfield | 6,091,256 A | 7/2000 | Long et al. |
| 5,910,727 A | 6/1999 | Fujihara et al. | 6,096,567 A | 8/2000 | Kaplan et al. |
| 5,912,046 A | 6/1999 | Eldridge et al. | 6,100,815 A | 8/2000 | Pailthorp |
| 5,914,613 A | 6/1999 | Gleason et al. | 6,104,201 A | 8/2000 | Beaman et al. |
| 5,914,614 A | 6/1999 | Beaman et al. | 6,104,206 A | 8/2000 | Verkuil |
| 5,916,689 A | 6/1999 | Collins et al. | 6,110,823 A | 8/2000 | Eldridge et al. |
| 5,917,707 A | 6/1999 | Khandros et al. | 6,114,864 A | 9/2000 | Soejima et al. |
| 5,923,180 A | 7/1999 | Botka et al. | 6,114,865 A | 9/2000 | Lagowski et al. |
| 5,926,029 A | 7/1999 | Ference et al. | 6,118,287 A | 9/2000 | Boll et al. |
| 5,926,951 A | 7/1999 | Khandros et al. | 6,118,894 A | 9/2000 | Schwartz et al. |
| 5,940,965 A | 8/1999 | Uhling et al. | 6,121,836 A | 9/2000 | Vallencourt |
| 5,944,093 A | 8/1999 | Viswanath | 6,124,725 A | 9/2000 | Sato |
| 5,945,836 A | 8/1999 | Sayre et al. | 6,127,831 A | 10/2000 | Khoury et al. |
| 5,949,383 A | 9/1999 | Hayes et al. | 6,130,536 A | 10/2000 | Powell et al. |
| 5,949,579 A | 9/1999 | Baker | 6,137,302 A | 10/2000 | Schwindt |
| 5,959,461 A | 9/1999 | Brown et al. | 6,144,212 A | 11/2000 | Mizuta |
| 5,963,364 A | 10/1999 | Leong et al. | 6,146,908 A | 11/2000 | Falque et al. |
| 5,966,645 A | 10/1999 | Davis | 6,147,502 A | 11/2000 | Fryer et al. |
| 5,970,429 A | 10/1999 | Martin | 6,147,851 A | 11/2000 | Anderson |
| 5,973,504 A | 10/1999 | Chong | 6,150,186 A | 11/2000 | Chen et al. |
| 5,974,662 A | 11/1999 | Eldridge et al. | 6,160,407 A | 12/2000 | Nikawa |
| 5,977,783 A | 11/1999 | Takayama et al. | 6,166,553 A | 12/2000 | Sinsheimer |
| 5,981,268 A | 11/1999 | Kovacs et al. | 6,168,974 B1 | 1/2001 | Chang et al. |
| 5,982,166 A | 11/1999 | Mautz | 6,169,410 B1 | 1/2001 | Grace et al. |
| 5,983,493 A | 11/1999 | Eldridge et al. | 6,172,337 B1 | 1/2001 | Johnsgard et al. |
| 5,993,611 A | 11/1999 | Moroney, III et al. | 6,174,744 B1 | 1/2001 | Watanabe et al. |
| 5,994,152 A | 11/1999 | Khandros et al. | 6,175,228 B1 | 1/2001 | Zamborelli et al. |
| 5,995,914 A | 11/1999 | Cabot | 6,176,091 B1 | 1/2001 | Kishi et al. |

| | | |
|---|---|---|
| 6,181,144 B1 | 1/2001 | Hembree et al. |
| 6,181,149 B1 | 1/2001 | Godfrey et al. |
| 6,181,297 B1 | 1/2001 | Leisten |
| 6,181,416 B1 | 1/2001 | Falk |
| 6,184,053 B1 | 2/2001 | Eldridge et al. |
| 6,184,587 B1 | 2/2001 | Khandros et al. |
| 6,184,845 B1 | 2/2001 | Leisten et al. |
| 6,191,596 B1 | 2/2001 | Abiko |
| 6,194,720 B1 | 2/2001 | Li et al. |
| 6,201,453 B1 | 3/2001 | Chan et al. |
| 6,206,273 B1 | 3/2001 | Beaman et al. |
| 6,208,225 B1 | 3/2001 | Miller |
| RE37,130 E | 4/2001 | Fiori, Jr. |
| 6,211,663 B1 | 4/2001 | Moulthrop et al. |
| 6,211,837 B1 | 4/2001 | Crouch et al. |
| 6,215,196 B1 | 4/2001 | Eldridge et al. |
| 6,215,295 B1 | 4/2001 | Smith, III |
| 6,215,670 B1 | 4/2001 | Khandros |
| 6,218,910 B1 | 4/2001 | Miller |
| 6,222,031 B1 | 4/2001 | Wakabayashi et al. |
| 6,222,970 B1 | 4/2001 | Wach et al. |
| 6,229,327 B1 | 5/2001 | Boll et al. |
| 6,232,149 B1 | 5/2001 | Dozier, II et al. |
| 6,232,787 B1 | 5/2001 | Lo et al. |
| 6,232,788 B1 | 5/2001 | Schwindt et al. |
| 6,232,789 B1 | 5/2001 | Schwindt |
| 6,233,613 B1 | 5/2001 | Walker et al. |
| 6,236,223 B1 | 5/2001 | Brady et al. |
| 6,242,803 B1 | 6/2001 | Khandros et al. |
| 6,242,929 B1 | 6/2001 | Mizuta |
| 6,245,692 B1 | 6/2001 | Pearce et al. |
| 6,246,247 B1 | 6/2001 | Eldridge et al. |
| 6,251,595 B1 | 6/2001 | Gordon et al. |
| 6,255,126 B1 | 7/2001 | Mathiue et al. |
| 6,256,882 B1 | 7/2001 | Gleason et al. |
| 6,257,564 B1 | 7/2001 | Avneri et al. |
| 6,257,565 B1 | 7/2001 | Houston et al. |
| 6,259,260 B1 | 7/2001 | Smith et al. |
| 6,265,950 B1 | 7/2001 | Schmidt et al. |
| 6,268,015 B1 | 7/2001 | Mathieu et al. |
| 6,268,016 B1 | 7/2001 | Bhatt et al. |
| 6,271,673 B1 | 8/2001 | Furuta et al. |
| 6,274,823 B1 | 8/2001 | Khandros et al. |
| 6,275,043 B1 | 8/2001 | Mühlberger et al. |
| 6,275,738 B1 | 8/2001 | Kasevich et al. |
| 6,278,051 B1 | 8/2001 | Peabody |
| 6,278,411 B1 | 8/2001 | Ohlsson et al. |
| 6,281,691 B1 | 8/2001 | Matsunaga et al. |
| 6,286,208 B1 | 9/2001 | Shih et al. |
| 6,292,760 B1 | 9/2001 | Burns |
| 6,295,729 B1 | 10/2001 | Beaman et al. |
| 6,300,775 B1 | 10/2001 | Peach et al. |
| 6,300,780 B1 | 10/2001 | Beaman et al. |
| 6,307,161 B1 | 10/2001 | Grube et al. |
| 6,307,363 B1 | 10/2001 | Anderson |
| 6,307,672 B1 | 10/2001 | DeNure |
| 6,310,483 B1 | 10/2001 | Taura et al. |
| 6,320,372 B1 | 11/2001 | Keller |
| 6,320,396 B1 | 11/2001 | Nikawa |
| 6,327,034 B1 | 12/2001 | Hoover et al. |
| 6,329,827 B1 | 12/2001 | Beaman et al. |
| 6,330,164 B1 | 12/2001 | Khandros et al. |
| 6,332,270 B2 | 12/2001 | Beaman et al. |
| 6,334,247 B1 | 1/2002 | Beaman et al. |
| 6,335,625 B1 | 1/2002 | Bryant et al. |
| 6,339,338 B1 | 1/2002 | Eldridge et al. |
| 6,340,568 B2 | 1/2002 | Hefti |
| 6,340,895 B1 | 1/2002 | Uher et al. |
| 6,351,885 B2 | 3/2002 | Suzuki et al. |
| 6,352,454 B1 | 3/2002 | Kim et al. |
| 6,359,456 B1 | 3/2002 | Hembree et al. |
| 6,362,792 B1 | 3/2002 | Sawamura et al. |
| 6,366,247 B1 | 4/2002 | Sawamura et al. |
| 6,369,776 B1 | 4/2002 | Leisten et al. |
| 6,376,258 B2 | 4/2002 | Hefti |
| 6,384,614 B1 | 5/2002 | Hager et al. |
| 6,384,615 B2 | 5/2002 | Schwindt |
| 6,388,455 B1 | 5/2002 | Kamieniecki et al. |
| 6,395,480 B1 | 5/2002 | Hefti |
| 6,396,296 B1 | 5/2002 | Tarter et al. |
| 6,396,298 B1 | 5/2002 | Young et al. |
| 6,400,168 B2 | 6/2002 | Matsunaga et al. |
| 6,404,213 B2 | 6/2002 | Noda |
| 6,407,542 B1 | 6/2002 | Conte |
| 6,407,562 B1 | 6/2002 | Whiteman |
| 6,409,724 B1 | 6/2002 | Penny et al. |
| 6,414,478 B1 | 7/2002 | Suzuki |
| 6,415,858 B1 | 7/2002 | Getchel et al. |
| 6,418,009 B1 | 7/2002 | Brunette |
| 6,420,722 B2 | 7/2002 | Moore et al. |
| 6,424,316 B1 | 7/2002 | Leisten |
| 6,429,029 B1 | 8/2002 | Eldridge et al. |
| 6,441,315 B1 | 8/2002 | Eldridge et al. |
| 6,442,831 B1 | 9/2002 | Khandros et al. |
| 6,447,339 B1 | 9/2002 | Reed et al. |
| 6,448,788 B1 | 9/2002 | Meaney et al. |
| 6,448,865 B1 | 9/2002 | Miller |
| 6,452,406 B1 | 9/2002 | Beaman et al. |
| 6,452,411 B1 | 9/2002 | Miller et al. |
| 6,456,099 B1 | 9/2002 | Eldridge et al. |
| 6,456,103 B1 | 9/2002 | Eldridge et al. |
| 6,459,343 B1 | 10/2002 | Miller |
| 6,459,739 B1 | 10/2002 | Vitenberg |
| 6,468,098 B1 | 10/2002 | Eldridge |
| 6,475,822 B2 | 11/2002 | Eldridge |
| 6,476,333 B1 | 11/2002 | Khandros et al. |
| 6,476,442 B1 | 11/2002 | Williams et al. |
| 6,476,630 B1 | 11/2002 | Whitten et al. |
| 6,479,308 B1 | 11/2002 | Eldridge |
| 6,480,013 B1 | 11/2002 | Nayler et al. |
| 6,480,978 B1 | 11/2002 | Roy et al. |
| 6,481,939 B1 | 11/2002 | Gillespie et al. |
| 6,482,013 B2 | 11/2002 | Eldridge et al. |
| 6,483,327 B1 | 11/2002 | Bruce et al. |
| 6,488,405 B1 | 12/2002 | Eppes et al. |
| 6,490,471 B2 | 12/2002 | Svenson et al. |
| 6,491,968 B1 | 12/2002 | Mathieu et al. |
| 6,496,024 B2 | 12/2002 | Schwindt |
| 6,499,121 B1 | 12/2002 | Roy et al. |
| 6,501,343 B2 | 12/2002 | Miller |
| 6,509,751 B1 | 1/2003 | Mathieu et al. |
| 6,512,482 B1 | 1/2003 | Nelson et al. |
| 6,520,778 B1 | 2/2003 | Eldridge et al. |
| 6,525,555 B1 | 2/2003 | Khandros et al. |
| 6,526,655 B2 | 3/2003 | Beaman et al. |
| 6,528,984 B2 | 3/2003 | Beaman et al. |
| 6,528,993 B1 | 3/2003 | Shin et al. |
| 6,529,844 B1 | 3/2003 | Kapetanic et al. |
| 6,534,856 B1 | 3/2003 | Dozier, II et al. |
| 6,538,214 B2 | 3/2003 | Khandros |
| 6,538,538 B2 | 3/2003 | Hreish et al. |
| 6,539,531 B2 | 3/2003 | Miller et al. |
| 6,548,311 B1 | 4/2003 | Knoll |
| 6,549,022 B1 | 4/2003 | Cole, Jr. et al. |
| 6,549,106 B2 | 4/2003 | Martin |
| 6,551,884 B2 | 4/2003 | Masuoka |
| 6,559,671 B2 | 5/2003 | Miller et al. |
| 6,566,079 B2 | 5/2003 | Hefti |
| 6,572,608 B1 | 6/2003 | Lee et al. |
| 6,573,702 B2 | 6/2003 | Marcuse et al. |
| 6,578,264 B1 | 6/2003 | Gleason et al. |
| 6,580,283 B1 | 6/2003 | Carbone et al. |
| 6,582,979 B2 | 6/2003 | Coccioli et al. |
| 6,587,327 B1 | 7/2003 | Devoe et al. |
| 6,597,187 B2 | 7/2003 | Eldridge et al. |
| 6,603,322 B1 | 8/2003 | Boll et al. |

| | | |
|---|---|---|
| 6,603,323 B1 | 8/2003 | Miller et al. |
| 6,603,324 B2 | 8/2003 | Eldridge et al. |
| 6,605,941 B2 | 8/2003 | Abe |
| 6,605,951 B1 | 8/2003 | Cowan |
| 6,605,955 B1 | 8/2003 | Costello et al. |
| 6,606,014 B2 | 8/2003 | Miller |
| 6,606,575 B2 | 8/2003 | Miller |
| 6,608,494 B1 | 8/2003 | Bruce et al. |
| 6,611,417 B2 | 8/2003 | Chen |
| 6,615,485 B2 | 9/2003 | Eldridge et al. |
| 6,616,966 B2 | 9/2003 | Mathieu et al. |
| 6,617,862 B1 | 9/2003 | Bruce |
| 6,617,866 B1 | 9/2003 | Ickes |
| 6,621,082 B2 | 9/2003 | Morita et al. |
| 6,621,260 B2 | 9/2003 | Eldridge et al. |
| 6,622,103 B1 | 9/2003 | Miller |
| 6,624,648 B2 | 9/2003 | Eldridge et al. |
| 6,627,461 B2 | 9/2003 | Chapman et al. |
| 6,627,483 B2 | 9/2003 | Ondricek et al. |
| 6,627,980 B2 | 9/2003 | Eldridge |
| 6,628,503 B2 | 9/2003 | Sogard |
| 6,628,980 B2 | 9/2003 | Atalar et al. |
| 6,633,174 B1 | 10/2003 | Satya et al. |
| 6,636,182 B2 | 10/2003 | Mehltretter |
| 6,639,461 B1 | 10/2003 | Tam et al. |
| 6,640,415 B2 | 11/2003 | Eslamy et al. |
| 6,640,432 B1 | 11/2003 | Mathieu et al. |
| 6,642,625 B2 | 11/2003 | Dozier, II et al. |
| 6,643,597 B1 | 11/2003 | Dunsmore |
| 6,644,982 B1 | 11/2003 | Ondricek et al. |
| 6,646,520 B2 | 11/2003 | Miller |
| 6,653,903 B2 | 11/2003 | Leich et al. |
| 6,655,023 B1 | 12/2003 | Eldridge et al. |
| 6,657,455 B2 | 12/2003 | Eldridge et al. |
| 6,657,601 B2 | 12/2003 | McLean |
| 6,661,316 B2 | 12/2003 | Hreish et al. |
| 6,664,628 B2 | 12/2003 | Khandros et al. |
| 6,669,489 B1 | 12/2003 | Dozier, II et al. |
| 6,672,875 B1 | 1/2004 | Mathieu et al. |
| 6,677,744 B1 | 1/2004 | Long |
| 6,678,850 B2 | 1/2004 | Roy et al. |
| 6,678,876 B2 | 1/2004 | Stevens et al. |
| 6,680,659 B2 | 1/2004 | Miller |
| 6,685,817 B1 | 2/2004 | Mathieu |
| 6,686,754 B2 | 2/2004 | Miller |
| 6,690,185 B1 | 2/2004 | Khandros et al. |
| 6,701,265 B2 | 3/2004 | Hill et al. |
| 6,701,612 B2 | 3/2004 | Khandros et al. |
| 6,707,548 B2 | 3/2004 | Kreimer et al. |
| 6,708,403 B2 | 3/2004 | Beaman et al. |
| 6,710,798 B1 | 3/2004 | Hershel et al. |
| 6,713,374 B2 | 3/2004 | Eldridge et al. |
| 6,714,828 B2 | 3/2004 | Eldridge et al. |
| 6,717,426 B2 | 4/2004 | Iwasaki |
| 6,720,501 B1 | 4/2004 | Henson |
| 6,722,032 B2 | 4/2004 | Beaman et al. |
| 6,724,205 B1 | 4/2004 | Hayden et al. |
| 6,724,928 B1 | 4/2004 | Davis |
| 6,727,579 B1 | 4/2004 | Eldridge et al. |
| 6,727,580 B1 | 4/2004 | Eldridge et al. |
| 6,727,716 B1 | 4/2004 | Sharif |
| 6,729,019 B2 | 5/2004 | Grube et al. |
| 6,731,804 B1 | 5/2004 | Carrieri et al. |
| 6,734,687 B1 | 5/2004 | Ishitani et al. |
| 6,737,920 B2 | 5/2004 | Jen et al. |
| 6,741,085 B1 | 5/2004 | Khandros et al. |
| 6,741,092 B2 | 5/2004 | Eldridge et al. |
| 6,741,129 B1 | 5/2004 | Corsi et al. |
| 6,744,268 B2 | 6/2004 | Hollman |
| 6,753,679 B1 | 6/2004 | Kwong et al. |
| 6,753,699 B2 | 6/2004 | Stockstad |
| 6,759,311 B2 | 7/2004 | Eldridge et al. |
| 6,759,859 B2 | 7/2004 | Deng et al. |
| 6,764,869 B2 | 7/2004 | Eldridge et al. |
| 6,768,328 B2 | 7/2004 | Self et al. |
| 6,770,955 B1 | 8/2004 | Coccioli et al. |
| 6,771,806 B1 | 8/2004 | Satya et al. |
| 6,777,319 B2 | 8/2004 | Grube et al. |
| 6,778,140 B1 | 8/2004 | Yeh |
| 6,778,406 B2 | 8/2004 | Eldridge et al. |
| 6,780,001 B2 | 8/2004 | Eldridge et al. |
| 6,784,674 B2 | 8/2004 | Miller |
| 6,784,677 B2 | 8/2004 | Miller |
| 6,784,679 B2 | 8/2004 | Sweet et al. |
| 6,788,093 B2 | 9/2004 | Aitren et al. |
| 6,788,094 B2 | 9/2004 | Khandros et al. |
| 6,791,176 B2 | 9/2004 | Mathieu et al. |
| 6,794,888 B2 | 9/2004 | Kawaguchi et al. |
| 6,794,934 B2 | 9/2004 | Betti-Berutto et al. |
| 6,794,950 B2 | 9/2004 | Du Toit et al. |
| 6,798,225 B2 | 9/2004 | Miller |
| 6,798,226 B2 | 9/2004 | Altmann et al. |
| 6,806,724 B2 | 10/2004 | Hayden et al. |
| 6,806,836 B2 | 10/2004 | Ogawa et al. |
| 6,807,734 B2 | 10/2004 | Eldridge et al. |
| 6,809,533 B1 | 10/2004 | Anlage et al. |
| 6,811,406 B2 | 11/2004 | Grube |
| 6,812,691 B2 | 11/2004 | Miller |
| 6,812,718 B1 | 11/2004 | Chong et al. |
| 6,815,963 B2 | 11/2004 | Gleason et al. |
| 6,816,031 B1 | 11/2004 | Miller |
| 6,816,840 B1 | 11/2004 | Goodwin, III |
| 6,817,052 B2 | 11/2004 | Grube |
| 6,818,840 B2 | 11/2004 | Khandros |
| 6,822,463 B1 | 11/2004 | Jacobs |
| 6,822,529 B2 | 11/2004 | Miller |
| 6,825,052 B2 | 11/2004 | Eldridge et al. |
| 6,825,422 B2 | 11/2004 | Eldridge et al. |
| 6,827,584 B2 | 12/2004 | Mathieu et al. |
| 6,833,724 B2 * | 12/2004 | Binkley et al. ............... 324/765 |
| 6,835,898 B2 | 12/2004 | Eldridge et al. |
| 6,836,962 B2 | 1/2005 | Khandros et al. |
| 6,838,885 B2 | 1/2005 | Kamitani |
| 6,838,893 B2 | 1/2005 | Khandros et al. |
| 6,839,964 B2 | 1/2005 | Henson |
| 6,845,491 B2 | 1/2005 | Miller et al. |
| 6,850,082 B2 | 2/2005 | Schwindt |
| 6,856,129 B2 | 2/2005 | Thomas et al. |
| 6,856,150 B2 | 2/2005 | Sporck et al. |
| 6,862,727 B2 | 3/2005 | Stevens |
| 6,864,105 B2 | 3/2005 | Grube et al. |
| 6,864,694 B2 | 3/2005 | McTigue |
| 6,870,359 B1 | 3/2005 | Sekel |
| 6,870,381 B2 | 3/2005 | Grube |
| 6,882,239 B2 | 4/2005 | Miller |
| 6,882,546 B2 | 4/2005 | Miller |
| 6,887,723 B1 | 5/2005 | Ondricek et al. |
| 6,888,362 B2 | 5/2005 | Eldridge et al. |
| 6,891,385 B2 | 5/2005 | Miller |
| 6,900,646 B2 | 5/2005 | Kasukabe et al. |
| 6,900,647 B2 | 5/2005 | Yoshida et al. |
| 6,900,652 B2 | 5/2005 | Mazur |
| 6,900,653 B2 | 5/2005 | Yu et al. |
| 6,902,416 B2 | 6/2005 | Feldman |
| 6,902,941 B2 | 6/2005 | Sun |
| 6,903,563 B2 | 6/2005 | Yoshida et al. |
| 6,906,506 B1 | 6/2005 | Reano et al. |
| 6,906,539 B2 | 6/2005 | Wilson et al. |
| 6,906,542 B2 | 6/2005 | Sakagawa et al. |
| 6,906,543 B2 | 6/2005 | Lou et al. |
| 6,907,149 B2 | 6/2005 | Slater |
| 6,908,364 B2 | 6/2005 | Back et al. |
| 6,909,297 B2 | 6/2005 | Ji et al. |
| 6,909,300 B2 | 6/2005 | Lu et al. |
| 6,909,983 B2 | 6/2005 | Sutherland |
| 6,910,268 B2 | 6/2005 | Miller |

| | | | | | |
|---|---|---|---|---|---|
| 6,911,814 B2 | 6/2005 | Miller et al. | 7,015,709 B2 | 3/2006 | Capps et al. |
| 6,911,826 B2 | 6/2005 | Plotnikov et al. | 7,015,710 B2 | 3/2006 | Yoshida et al. |
| 6,911,834 B2 | 6/2005 | Mitchell et al. | 7,015,711 B2 | 3/2006 | Rothaug et al. |
| 6,911,835 B2 | 6/2005 | Chraft et al. | 7,019,541 B2 | 3/2006 | Kittrell |
| 6,912,468 B2 | 6/2005 | Marin et al. | 7,019,544 B1 | 3/2006 | Jacobs et al. |
| 6,913,468 B2 | 7/2005 | Dozier, II et al. | 7,019,701 B2 | 3/2006 | Ohno et al. |
| 6,914,244 B2 | 7/2005 | Alani | 7,020,360 B2 | 3/2006 | Satomura et al. |
| 6,914,427 B2 | 7/2005 | Gifford et al. | 7,020,363 B2 | 3/2006 | Johannessen |
| 6,914,430 B2 | 7/2005 | Hasegawa et al. | 7,022,976 B1 | 4/2006 | Santana, Jr. et al. |
| 6,914,580 B2 | 7/2005 | Leisten | 7,022,985 B2 | 4/2006 | Knebel et al. |
| 6,917,195 B2 | 7/2005 | Hollman | 7,023,225 B2 | 4/2006 | Blackwood |
| 6,917,210 B2 | 7/2005 | Miller | 7,023,226 B2 | 4/2006 | Okumura et al. |
| 6,917,211 B2 | 7/2005 | Yoshida et al. | 7,023,231 B2 | 4/2006 | Howland, Jr. et al. |
| 6,917,525 B2 | 7/2005 | Mok et al. | 7,025,628 B2 | 4/2006 | LaMeres et al. |
| 6,919,732 B2 | 7/2005 | Yoshida et al. | 7,026,832 B2 | 4/2006 | Chaya et al. |
| 6,922,069 B2 | 7/2005 | Jun | 7,026,833 B2 | 4/2006 | Rincon et al. |
| 6,924,653 B2 | 8/2005 | Schaeffer et al. | 7,026,834 B2 | 4/2006 | Hwang |
| 6,924,655 B2 | 8/2005 | Kirby | 7,026,835 B2 | 4/2006 | Farnworth et al. |
| 6,927,078 B2 | 8/2005 | Saijyo et al. | 7,030,328 B1 | 4/2006 | Beerling |
| 6,927,079 B1 | 8/2005 | Fyfield | 7,030,599 B2 | 4/2006 | Douglas |
| 6,927,586 B2 | 8/2005 | Thiessen | 7,030,827 B2 | 4/2006 | Mahler et al. |
| 6,927,587 B2 | 8/2005 | Yoshioka | 7,032,307 B2 | 4/2006 | Matsunaga et al. |
| 6,927,598 B2 | 8/2005 | Lee et al. | 7,034,553 B2 | 4/2006 | Gilboe |
| 6,930,498 B2 | 8/2005 | Tervo et al. | 7,035,738 B2 | 4/2006 | Matsumoto et al. |
| 6,933,713 B2 | 8/2005 | Cannon | 7,057,404 B2 | 6/2006 | Gleason et al. |
| 6,933,717 B1 | 8/2005 | Dogaru et al. | 7,071,722 B2 | 7/2006 | Yamada et al. |
| 6,933,725 B2 | 8/2005 | Lim et al. | 7,088,981 B2 | 8/2006 | Chang |
| 6,933,736 B2 | 8/2005 | Kobayashi et al. | 7,096,133 B1 | 8/2006 | Martin et al. |
| 6,933,737 B2 | 8/2005 | Sugawara | 7,102,366 B2 * | 9/2006 | Denen et al. ................ 324/679 |
| 6,937,020 B2 | 8/2005 | Munson et al. | 7,161,363 B2 | 1/2007 | Gleason et al. |
| 6,937,037 B2 | 8/2005 | Eldridge et al. | 7,173,433 B2 | 2/2007 | Hoshi et al. |
| 6,937,040 B2 | 8/2005 | Maeda et al. | 7,187,188 B2 | 3/2007 | Andrews et al. |
| 6,937,042 B2 | 8/2005 | Yoshida et al. | 7,188,037 B2 | 3/2007 | Hidehira |
| 6,937,045 B2 | 8/2005 | Sinclair | 7,219,416 B2 | 5/2007 | Inoue et al. |
| 6,937,341 B1 | 8/2005 | Woollam et al. | 7,233,160 B2 | 6/2007 | Hayden et al. |
| 6,940,264 B2 | 9/2005 | Ryken, Jr. et al. | 7,253,646 B2 | 8/2007 | Lou et al. |
| 6,940,283 B2 | 9/2005 | McQueeney | 7,271,603 B2 | 9/2007 | Gleason et al. |
| 6,943,563 B2 | 9/2005 | Martens | 7,276,922 B2 | 10/2007 | Miller et al. |
| 6,943,571 B2 | 9/2005 | Worledge | 7,315,175 B2 | 1/2008 | Cole |
| 6,943,574 B2 | 9/2005 | Altmann et al. | 7,319,335 B2 | 1/2008 | Brunner et al. |
| 6,944,380 B1 | 9/2005 | Hideo et al. | 7,319,337 B2 | 1/2008 | Sakata |
| 6,946,859 B2 | 9/2005 | Karavakis et al. | 7,323,680 B2 | 1/2008 | Chong |
| 6,946,860 B2 | 9/2005 | Cheng et al. | 7,323,899 B2 | 1/2008 | Schuette et al. |
| 6,946,864 B2 | 9/2005 | Gramann et al. | 7,327,153 B2 | 2/2008 | Weinraub |
| 6,948,391 B2 | 9/2005 | Brassell et al. | 7,332,918 B2 | 2/2008 | Sugiyama, et al. |
| 6,948,981 B2 | 9/2005 | Pade | 7,332,923 B2 | 2/2008 | Schott, et al. |
| 6,949,942 B2 | 9/2005 | Eldridge et al. | 7,342,402 B2 | 3/2008 | Kim et al. |
| 6,970,001 B2 | 11/2005 | Chheda et al. | 7,403,028 B2 | 7/2008 | Campbell |
| 6,987,483 B2 | 1/2006 | Tran | 7,427,868 B2 | 9/2008 | Strid et al. |
| 7,001,785 B1 | 2/2006 | Chen | 2001/0002794 A1 | 6/2001 | Draving et al. |
| 7,002,133 B2 | 2/2006 | Beausoleil et al. | 2001/0009061 A1 | 7/2001 | Gleason et al. |
| 7,002,363 B2 | 2/2006 | Mathieu | 2001/0009377 A1 | 7/2001 | Schwindt et al. |
| 7,002,364 B2 | 2/2006 | Kang et al. | 2001/0010468 A1 | 8/2001 | Gleason et al. |
| 7,003,184 B2 | 2/2006 | Ronnekleiv et al. | 2001/0020283 A1 | 9/2001 | Sakaguchi |
| 7,005,842 B2 | 2/2006 | Fink et al. | 2001/0024116 A1 | 9/2001 | Draving |
| 7,005,868 B2 | 2/2006 | McTigue | 2001/0030549 A1 | 10/2001 | Gleason et al. |
| 7,005,879 B1 | 2/2006 | Robertazzi | 2001/0043073 A1 | 11/2001 | Montoya |
| 7,006,046 B2 | 2/2006 | Aisenbrey | 2001/0044152 A1 | 11/2001 | Burnett |
| 7,007,380 B2 | 3/2006 | Das et al. | 2001/0045511 A1 | 11/2001 | Moore et al. |
| 7,009,188 B2 | 3/2006 | Wang | 2001/0054906 A1 | 12/2001 | Fujimura |
| 7,009,383 B2 | 3/2006 | Harwood et al. | 2002/0005728 A1 | 1/2002 | Babson et al. |
| 7,009,415 B2 | 3/2006 | Kobayashi et al. | 2002/0008533 A1 | 1/2002 | Ito et al. |
| 7,011,531 B2 | 3/2006 | Egitto et al. | 2002/0009377 A1 | 1/2002 | Shafer |
| 7,012,425 B2 | 3/2006 | Shoji | 2002/0009378 A1 | 1/2002 | Obara |
| 7,012,441 B2 | 3/2006 | Chou et al. | 2002/0011859 A1 | 1/2002 | Smith et al. |
| 7,013,221 B1 | 3/2006 | Friend et al. | 2002/0011863 A1 | 1/2002 | Takahashi et al. |
| 7,014,499 B2 | 3/2006 | Yoon | 2002/0030480 A1 | 3/2002 | Appen et al. |
| 7,015,455 B2 | 3/2006 | Mitsuoka et al. | 2002/0050828 A1 | 5/2002 | Seward, IV et al. |
| 7,015,689 B2 | 3/2006 | Kasajima et al. | 2002/0070743 A1 | 6/2002 | Felici et al. |
| 7,015,690 B2 | 3/2006 | Wang et al. | 2002/0070745 A1 | 6/2002 | Johnson et al. |
| 7,015,703 B2 | 3/2006 | Hopkins et al. | 2002/0079911 A1 | 6/2002 | Schwindt |
| 7,015,707 B2 | 3/2006 | Cherian | 2002/0105396 A1 | 8/2002 | Streeter et al. |
| 7,015,708 B2 | 3/2006 | Beckous et al. | 2002/0109088 A1 | 8/2002 | Nara et al. |

| | | |
|---|---|---|
| 2002/0118034 A1 | 8/2002 | Laureanti |
| 2002/0149377 A1 | 10/2002 | Hefti et al. |
| 2002/0153909 A1 | 10/2002 | Petersen et al. |
| 2002/0163769 A1 | 11/2002 | Brown |
| 2002/0168659 A1 | 11/2002 | Hefti et al. |
| 2002/0176160 A1 | 11/2002 | Suzuki et al. |
| 2002/0180466 A1 | 12/2002 | Hiramatsu et al. |
| 2002/0197709 A1 | 12/2002 | van der Weide et al. |
| 2003/0010877 A1 | 1/2003 | Landreville et al. |
| 2003/0030822 A1 | 2/2003 | Finarov |
| 2003/0032000 A1 | 2/2003 | Liu et al. |
| 2003/0040004 A1 | 2/2003 | Hefti et al. |
| 2003/0057513 A1 | 3/2003 | Leedy |
| 2003/0062915 A1 | 4/2003 | Arnold et al. |
| 2003/0072549 A1 | 4/2003 | Facer et al. |
| 2003/0076585 A1 | 4/2003 | Ledley |
| 2003/0077649 A1 | 4/2003 | Cho et al. |
| 2003/0088180 A1 | 5/2003 | Van Veen et al. |
| 2003/0119057 A1 | 6/2003 | Gascoyne et al. |
| 2003/0139662 A1 | 7/2003 | Seidman |
| 2003/0139790 A1 | 7/2003 | Ingle et al. |
| 2003/0155939 A1 | 8/2003 | Lutz et al. |
| 2003/0170898 A1 | 9/2003 | Gundersen et al. |
| 2003/0184332 A1 | 10/2003 | Tomimatsu et al. |
| 2003/0215966 A1 | 11/2003 | Rolda et al. |
| 2003/0234659 A1 | 12/2003 | Zieleman |
| 2004/0015060 A1 | 1/2004 | Samsoondar et al. |
| 2004/0021475 A1 | 2/2004 | Ito et al. |
| 2004/0029425 A1 | 2/2004 | Yean et al. |
| 2004/0061514 A1 | 4/2004 | Schwindt et al. |
| 2004/0066181 A1 | 4/2004 | Theis |
| 2004/0069776 A1 | 4/2004 | Fagrell et al. |
| 2004/0090223 A1 | 5/2004 | Yonezawa |
| 2004/0095145 A1 | 5/2004 | Boudiaf et al. |
| 2004/0095641 A1 | 5/2004 | Russum et al. |
| 2004/0100276 A1 | 5/2004 | Fanton |
| 2004/0100297 A1 | 5/2004 | Tanioka et al. |
| 2004/0108847 A1 | 6/2004 | Stoll et al. |
| 2004/0113640 A1 | 6/2004 | Cooper et al. |
| 2004/0130787 A1 | 7/2004 | Thome-Forster et al. |
| 2004/0132222 A1 | 7/2004 | Hembree et al. |
| 2004/0134899 A1 | 7/2004 | Hiramatsu et al. |
| 2004/0140819 A1 | 7/2004 | McTigue et al. |
| 2004/0147034 A1 | 7/2004 | Gore et al. |
| 2004/0162689 A1 | 8/2004 | Jamneala et al. |
| 2004/0170312 A1 | 9/2004 | Soenksen |
| 2004/0175294 A1 | 9/2004 | Ellison et al. |
| 2004/0186382 A1 | 9/2004 | Modell et al. |
| 2004/0193382 A1 | 9/2004 | Adamian et al. |
| 2004/0197771 A1 | 10/2004 | Powers et al. |
| 2004/0199350 A1 | 10/2004 | Blackham et al. |
| 2004/0201388 A1 | 10/2004 | Barr |
| 2004/0207072 A1 | 10/2004 | Hiramatsu et al. |
| 2004/0207424 A1 | 10/2004 | Hollman |
| 2004/0239338 A1 | 12/2004 | Johnsson et al. |
| 2004/0246004 A1 | 12/2004 | Heuermann |
| 2004/0251922 A1 | 12/2004 | Martens et al. |
| 2005/0024069 A1 | 2/2005 | Hayden et al. |
| 2005/0026276 A1 | 2/2005 | Chou |
| 2005/0030047 A1 | 2/2005 | Adamian |
| 2005/0054029 A1 | 3/2005 | Tomimatsu et al. |
| 2005/0062533 A1 | 3/2005 | Vice |
| 2005/0068054 A1 | 3/2005 | Mok et al. |
| 2005/0083130 A1 | 4/2005 | Grilo |
| 2005/0088191 A1 | 4/2005 | Lesher |
| 2005/0101846 A1 | 5/2005 | Fine et al. |
| 2005/0116730 A1 | 6/2005 | Hsu |
| 2005/0142033 A1 | 6/2005 | Glezer et al. |
| 2005/0151548 A1 | 7/2005 | Hayden et al. |
| 2005/0156675 A1 | 7/2005 | Rohde et al. |
| 2005/0164160 A1 | 7/2005 | Gunter et al. |
| 2005/0165316 A1 | 7/2005 | Lowery et al. |
| 2005/0168722 A1 | 8/2005 | Forstner et al. |
| 2005/0172703 A1 | 8/2005 | Kley |
| 2005/0174191 A1 | 8/2005 | Brunker et al. |
| 2005/0178980 A1 | 8/2005 | Skidmore et al. |
| 2005/0179444 A1 | 8/2005 | Tiemeijer |
| 2005/0195124 A1 | 9/2005 | Puente Baliarda et al. |
| 2005/0229053 A1 | 10/2005 | Sunter |
| 2005/0236587 A1 | 10/2005 | Kodama et al. |
| 2005/0237102 A1 | 10/2005 | Tanaka |
| 2006/0030060 A1 | 2/2006 | Noguchi et al. |
| 2006/0052075 A1 | 3/2006 | Galivanche et al. |
| 2006/0155270 A1 | 7/2006 | Hancock et al. |
| 2006/0184041 A1 | 8/2006 | Andrews et al. |
| 2006/0220663 A1 | 10/2006 | Oikawa |
| 2006/0226864 A1 | 10/2006 | Kramer |
| 2007/0024506 A1 | 2/2007 | Hardacker |
| 2007/0030021 A1 | 2/2007 | Cowan et al. |
| 2007/0145989 A1 | 6/2007 | Zhu et al. |
| 2008/0111571 A1 | 5/2008 | Smith et al. |

FOREIGN PATENT DOCUMENTS

| | | |
|---|---|---|
| CN | 1083975 | 3/1994 |
| DE | 2951072 | 7/1981 |
| DE | 3426565 | 1/1986 |
| DE | 3637549 | 5/1988 |
| DE | 288234 | 3/1991 |
| DE | 4223658 | 1/1993 |
| DE | 9313420 | 10/1993 |
| DE | 19522774 | 1/1997 |
| DE | 19542955 | 5/1997 |
| DE | 19618717 | 1/1998 |
| DE | 19749687 | 5/1998 |
| DE | 29809568 | 10/1998 |
| DE | 10000324 | 7/2001 |
| DE | 20220754 | 5/2004 |
| EP | 0230766 | 12/1985 |
| EP | 0195520 | 9/1986 |
| EP | 0230348 | 7/1987 |
| EP | 0259163 | 3/1988 |
| EP | 0259183 | 3/1988 |
| EP | 0259942 | 3/1988 |
| EP | 0261986 | 3/1988 |
| EP | 0270422 | 6/1988 |
| EP | 0333521 | 9/1989 |
| EP | 0460911 | 12/1991 |
| EP | 0846476 | 6/1998 |
| EP | 0945736 | 9/1999 |
| GB | 579665 | 8/1946 |
| GB | 2014315 | 8/1979 |
| GB | 2179458 | 3/1987 |
| JP | 52-19046 | 2/1977 |
| JP | 53037077 | 4/1978 |
| JP | 53-052354 | 5/1978 |
| JP | 55115383 | 9/1980 |
| JP | 56-007439 | 1/1981 |
| JP | 5691503 | 7/1981 |
| JP | 56088333 | 7/1981 |
| JP | 57075480 | 5/1982 |
| JP | 57163035 | 10/1982 |
| JP | 57171805 | 10/1982 |
| JP | 58-130602 | 8/1983 |
| JP | 594189 U | 1/1984 |
| JP | 60-5462 | 4/1984 |
| JP | 60-236241 | 11/1985 |
| JP | 61142802 | 6/1986 |
| JP | 62-11243 | 1/1987 |
| JP | 62-51235 | 3/1987 |
| JP | 62-58650 | 3/1987 |
| JP | 62098634 | 5/1987 |
| JP | 62107937 | 5/1987 |
| JP | 62-179126 | 8/1987 |
| JP | 62239050 | 10/1987 |
| JP | 62295374 | 12/1987 |

| | | |
|---|---|---|
| JP | 63-108736 | 5/1988 |
| JP | 63-129640 | 6/1988 |
| JP | 63-143814 | 6/1988 |
| JP | 63-152141 | 6/1988 |
| JP | 63-192246 | 8/1988 |
| JP | 63-318745 | 12/1988 |
| JP | 64-21309 | 2/1989 |
| JP | 1-165968 | 6/1989 |
| JP | 1-214038 | 8/1989 |
| JP | 01209380 | 8/1989 |
| JP | 1-219575 | 9/1989 |
| JP | 1-296167 | 11/1989 |
| JP | 2-22836 | 1/1990 |
| JP | 2-141681 | 5/1990 |
| JP | 02124469 | 5/1990 |
| JP | 02135804 | 5/1990 |
| JP | 2-191352 | 7/1990 |
| JP | 3-175367 | 7/1991 |
| JP | 3196206 | 8/1991 |
| JP | 03228348 | 10/1991 |
| JP | 04130639 | 5/1992 |
| JP | 04159043 | 6/1992 |
| JP | 04206930 | 7/1992 |
| JP | 4-340248 | 11/1992 |
| JP | 05082631 | 4/1993 |
| JP | 5-113451 | 5/1993 |
| JP | 5157790 | 6/1993 |
| JP | 5166893 | 7/1993 |
| JP | 6-71425 | 3/1994 |
| JP | 6-85044 | 3/1994 |
| JP | 6-102313 | 4/1994 |
| JP | 6-132709 | 5/1994 |
| JP | 6-160236 | 6/1994 |
| JP | 6154238 | 6/1994 |
| JP | 6-295949 | 10/1994 |
| JP | 7005078 | 1/1995 |
| JP | 7012871 | 1/1995 |
| JP | 7-201945 | 8/1995 |
| JP | 8035987 | 2/1996 |
| JP | 8-261898 | 10/1996 |
| JP | 08330401 | 12/1996 |
| JP | 09127432 | 5/1997 |
| JP | 10-48256 | 2/1998 |
| JP | 10116866 | 5/1998 |
| JP | 11004001 | 1/1999 |
| JP | 110023975 | 1/1999 |
| JP | 2001-33633 | 2/2000 |
| JP | 2000-137120 | 5/2000 |
| JP | 2000-329664 | 11/2000 |
| JP | 2001-124676 | 5/2001 |
| JP | 2001-189285 | 7/2001 |
| JP | 2001-189378 | 7/2001 |
| JP | 2002-203879 | 7/2002 |
| JP | 2002243502 | 8/2002 |
| JP | 2004-507851 | 3/2004 |
| KR | 2003/0090158 | 11/2003 |
| SU | 843400 | 6/1981 |
| SU | 1195402 | 11/1985 |
| SU | 1327023 | 7/1987 |
| SU | 1392603 | 4/1988 |
| WO | WO80/00101 | 1/1980 |
| WO | WO94/10554 | 5/1994 |
| WO | WO 96/29629 | 1/1996 |
| WO | WO 97/50001 | 12/1997 |
| WO | WO98/07040 | 2/1998 |
| WO | WO00/73905 | 12/2000 |
| WO | WO01/07207 | 2/2001 |
| WO | WO 01/69656 | 9/2001 |
| WO | WO 2004/044604 | 5/2004 |
| WO | WO 2004/065944 | 8/2004 |
| WO | WO 2004/079299 | 9/2004 |
| WO | WO 2005/062025 | 7/2005 |
| WO | WO 2007/145727 | 12/2007 |
| WO | WO 2007/145728 | 12/2007 |

OTHER PUBLICATIONS

Cohn. Seymour B., "Optimum Design of Stepped Transmission-Line Transformers." I.R.E. Transactions—Microwave Theory and Techniques. No. 3, 1955. pp. 16-21.

Hopper, Samuel, "The Design of Ridged Waveguides," I.R.E. Transactions—Microwave Theory and techniques. No. 5, Oct. 1955, pp. 20-29.

Chen, Tsung-Shan, "Calculation of Parameters of Ridge Waveguides," IRE Transactions on Microwave Theory and Techniques. Jan. 1957, pp. 12-17.

IRE 20.1, Committee Personnel, "IRE Standards on Methods of Measuring Noise in Linear Twoports, 1959," Proc. IRE, vol. 48, pp. 60-68, Jan. 1960, pp. 32-40.

Fukui, H., "Available Power Gain, Noise Figure, and Noise Measure of Two-Ports and Their Graphical Representations," pp. 18-23, Reprinted from IEEE Trans. Circuit Theory. vol. CT-13, pp. 137-142. Jun. 1966.

Beaubien, M.J., et al., "An Accurate Finite-Difference Method for Higher Order Waveguide Modes," IEEE Transactions on Microwave Theory and Techniques, vol. M11-16, No. 12, Dec. 1968, pp. 1007-1017.

Lane, Richard Q., "The Determination of Device Noise Parameters," Proc. IEEE, vol. 57, Aug. 1969. pp. 1461-1462.

Adamian, Vaheh, et al., "A Novel Procedure for Receiver Noise Characterization," IEEE Transactions on Instrumentation and Measurement, Jun. 1973.

Daly, P., "Polar Geometry Waveguides by finite-element Methods," IEEE Transactions on Microwave Theory and Technique, vol. MTT-22, No. 3, Mar. 1974, pp. 202-209.

Fink, Donald G., et al., "Electronics Engineers' Handbook," Sec. 17-52 Measurement and Control Circuits, 1975, pp. 17-22-17-27.

Bry, A., et al, "Bypass Capacitor for Chip Probe," IBM Technical Disclosure Bulletin, vol. 18, No. 11, Apr. 1976.

Skobern, J.R., "Subminiature High-Frequency Probe," IBM Technical disclosure Bulletin, vol. 19. No. 10, Mar. 1977.

Berg, William, et al., "Elastomers solve tough problems in high-frequency systems." 2119 EDN vol. 23, Jan. 5, 1978, pp. 36-42.

Eisenhart, R.L., "A Better Microstrip Connector," 1978 IEEE MTT-S International Microwave Symposium Digest, Jun. 27-29, Ottawa, Canada.

Gommlich, Hans, et al., "Verzerrungsmessungen-Wichtige Aufgabe in der Ubertragungstechnik," Elektronik 8/ Apr. 23, 1982, pp. 110-119.

Larock, V., et al.. "Automatic Noise Temperature Measurement Through Frequency Variation," IEEE Transactions on Microwave Theory and Techniques, vol. MTT-30, No. 8, Aug. 1982, pp. 1286-1288.

Maury Microwave Corp., "Transistor Test Fixture (TTF) Inserts. Calibration & Check Devices, MT951, MT952, MT953 Series," Advanced Data 4T-002, Sept. 20, 1982, pp. 1-2.

Maury Microwave Corp., "Transistor Test Fixture (TTF) Software," MT950D Series, Sep. 20, 1982, 2 pages.

Maury Microwave Corp., "Transistor Test Fixture (TTF)," MT950 Series, Advanced data 4T-001. Oct. 7, 1982.

Abbott. D.A., et al., "Automatic noise figure measurements with computer control and correction," 8054 Radio and Electronic Engineer vol. 52, Oct. 1982, pp. 468-474.

Swain, Howard L. et al., "Noise Figure Meter Sets Records for Accuracy, Repeatability, and Convenience," 1266 Hewlett-Packard Journal, vol. 34, No. 4, Apr. 1983. pp. 23-34.

Adamian, V. et al.. "Simplified Noise Evaluation of Microwave Receiver," IEEE Transactions on Instrumentation and Measurement. vol. IM-33, No. 2, Jun. 1984. 136-140.

Pastori, William E., "High accuracy microwave noise figure measurements." 8029 Electronic Engineering 56, No. 1984, pp. 181-189.

Inter-Continental Microwave. "Product Catalog," VMC 1055 Jan. 1986.

Design Technique, "Microstrip Microwave Test Fixture," May 1986.

Cascade Microtech. Inc., "Wide Probe Assembly," Full Scale Drawing, May 29, 1986, 2 pages.

Jackson, Robert et al., "Surface-to-Surface Transition via Electromagnetic Coupling of Coplanar Waveguides," Nov. 1987, 8099 IEEE Transactions on Microwave Theory and Techniques MTT-35, pp. 1027-1032.

Sharma, A., "Tunable Waveguide-to-Microstrip Transition for Millimeter-Wave Applications," IEE MTT-S Digest 1987, pp. 353-356.

Izadian, Jamal S., "Unified Design Plans Aid Waveguide Transitions," Microwaves & R&F, May 1987, pp. 213-222.

Mazilu, T., "A Self-Adjusting Waveguide-to-Microstrip Transition," Microwave Journal, Jul. 1987, pp. 133-134.

Carlton, D.E. et al., "Accurate Measurement of High-speed Package and Interconnect Parasitics," IEEE 1988 Custom Integrated Circuits Conference, pp. 23.3.1-23.3.6.

Fraser, Artur, et al., "GHz On-Silicon-Wafer Probing Calibration Methods," Paper 7.6, IEEE 1988 Bipolor Circuits & Technology Meeting, pp. 154-157.

Modolo, John A., et al, "Wafer level high-frequency measurements of photodetector characteristics," Applied Optics, vol. 27 pp. 3059-3061, Aug. 1988.

Design Technique, "Adjustable Test Fixture," 1988.

Tong, Peter R., et al., "Noise Measurements at MM-Wave Frequencies," 176 Microwave Journal 31, Jul. 1988.

Barsotti, C., et al., "New Probe Cards Replace Needle Types," Semiconductor International, Aug. 1988, pp. 98-101.

Microwave Journal, "Microwave Products." Sep. 1988, pp. 297.

Cascade Microtech Microprobe Update, "Spurious propagation, modes removed by probe absorber." Apr. 1989.

Esteban, J., et al., "Mode Spectrum of Waveguides Using A Transverse S-Matrix Resonance Method," AP-S International Symposium 1989, IEEE Catalog No. CH-2654-2189, San Jose, CA. Jun. 26-30, 1989, pp. 1263-1267.

Ponchak, George, et al., "A New Rectangular Waveguide to Coplaner Waveguide Transition," Prepared for 1990 IEEE MTT-S International Microwave Symposium to be held between May 8-10, 1990 in Dallas. Texas, Jan. 1990.

Dalman, G.C., "New Waveguide-to-Coplaner Waveguide Transition for Centimetre and Millimetre Wave Applications," Electronics Letters, Jun. 21, 1990, vol. 26, No. 13.

Cascade Microtech WPH-700 series, "Multicontact High-Speed Integrated Circuit," 1991, 700S-591.

Liu, S.M. Joseph, et al., "A New Probe for W-band On-wafer Measurements." IEEE MTT-S Digest. 1993. pp. 1335-1338.

Photo of Micromanipulator Probe Station. 1994.

Maury Microwave Corp., Transistor Test Fixture (TTF) MT950 Series. May 31, 1995, Advanced Data, 4T-0011.

Cascade Microtech, "Layout rules for WPH-900 Series probes," Applications Note, 1996.

Cascade Microtech, "Air coplanar Probe Series," 1997.

Yong-Dae, Kim , et al. "Fabrication of silicon Micro-Probe for Vertical Probe Card Application," Jpn. J. Appl. Phys. vol. 37, Part I, No. 12B, Dec. 1998, pp. 7070-7073.

"A Broadband Microwave choke," Microwave Journal, Dec. 1999.

"The Air Coplanar Probe offers a highly compliant, rugged probe with lowest insertion loss available," Cascade Microtech, Inc., Air coplanar Probe Series, 2000.

Cascade Microtech, "On-Wafer Test Solutions for State-of-the-Art Electro-Optical Components," 2001.

Purroy, F. et al., "New Theoretical Analysis of the LRRm Calibration Technique for Vector Network Analyzers," IEEE Transactions on Instrumentation and Measurement, vol. 50, No. 5, Oct. 2001, pp. 1307-1313.

"Laser Diode Test Solution," Oct. 9, 2002, http:/www.cascademicrotech.com/index.cfm/fuseaction/pg.view/pID/136.

Liang, Qingqing, et al., "Accurate ac Transistor Characterization to 110 GHz Using a New Four-port Self-Calibrated Extraction Technique," 2004 Topical Meeting on Silicon Monolitic Integrated Circuits in RF Systems, pp. 282-285.

Cascade Microwave, "Introducing the World's First Microwave Wafer Probing Equipment," 4 pages, 1983.

Malm, R.L. "Reduction of Stray Fields About SEM Samples," IBM Technical Disclosure Bulletin, vol. 21, No. 7, Dec. 1978 2 pages.

Kuhn, Nick, "Accurate and Automatic Noise Figure Measurements with Standard Equipment," Hewlett-Packard co., Inc., Stanford Park Division 1501 Page Mill Road, Palo Alto, CA 94304, 3 pages Conference: Technology Grow for the 80's. 1980 IEEE MTT-S International Microwave Symposium Digest. Washington, DC, May 28-30, 1980.

The Micromanipulator Company, data sheet, Double Sided Probing System, Jul. 2002, 2 pages.

International Search Report for PCT/US06/16238 mailed Feb. 28, 2007.

Written Opinion of the International Searching Authority for PCT/US06/16238, mailed Feb. 28, 2007.

Partial International Search Report for PCT/US2005/039561, mailed Mar. 21, 2006.

International Search Report for PCT/US2005/039561, mailed May 18, 2006.

Written Opinion of the International Searching Authority for PCT/US2005/039561, mailed May 18, 2006.

Mark S. Boguski and Martin W. McIntosh, "Biomedical informatics for proteomics," insight: review article, Nature 422, 233-237 (2003); doi:10.1038/nature01515.

L.L. Sohn, O.A.Saleh, G.R. Facer, A.J. Beavis, R.S. Allan, and D.A. Notterman, "Capacitance cytometry: Measuring biological cells one by one," PNAS Sep. 26, 2000, vol. 97 No. 20 pp. 10687-10690, www.pnas.org.

Sam Hanash, "insight review articles, Disease proteomics," Nature, vol. 422, Mar. 13, 2003, pp. 226-232.

Mike Tyers and Matthias Mann, "insight overview, From genomics to proteomics," Nature, vol. 422, Mar. 13, 2003, pp. 193-197.

Andrej Sali, Robert Glaeser, Thomas Earnest, and Wolfgang Baumeister, "insight: review article From words to literature in structural proteomics," Nature 422, 216-225 (2003); doi: 10.1038/nature01513.

Ruedi Aebersold and Matthias Mann, "insight review articles, Mass spectrometry-based proteomics," Nature, vol. 422, Mar. 13, 2003, pp. 198-207.

Barbara Marte, Senior Editor, "Nature insight Proteomics," Nature vol. 422, Mar. 13, 2003 pp. 191-194.

Eric Phizicky, Philippe I. H. Bastiaens, Heng Zhu, Michael Snyder, and Stanley Fields, "insight: review article Protein analysis on a proteomic scale," Nature 422, 208-215 (2003); doi: 10.1038/nature01512.

Qingqing Liang, et al., "Accurate ac Transistor Characterization to 110 GHz Using a New Four-port Self-Calibrated Extraction Technique," IEEE, 2004 Topical Meeting on Silicon Monolithic Integrated Circuits in RF Systems, pp. 282-285.

Francesc Purroy and Lluis Pradell, "New Theoretical Analysis of the LRRM Calibration Technique for Vector Network Analyzers," IEEE Transactions on Instrumentation and Measurement, vol. 50, No. 5, Oct. 2001, pp. 1307-1313.

Christophe Risacher, et al., "Wavequide-to-Microstrip Transition With Integrated Bias-T," IEEE Microwave and Wireless Components Letters, vol. 13, No. 7, Jul. 2003, pp. 262-264.

Saswata Basu and Leonard Hayden, "An SOLR Calibration for Accurate Measurement of Orthogonal On-Wafer DUTS," 1997 IEEE MTT-S Digest, pp. 1335-1338.

Deming Xu, Liping Liu, and Zhiyan Jiang, "Measurement of the Dielectric Properties of Biological Substances Using an Improved Open-Ended Coaxial Line Resonator Method," IEEE Transactions on Microwave Theory and Techniques, vol. MTT-35, No. 12, Dec. 1987, pp. 1424-1428.

Mohammed Nurul Afsar, James R. Birch, and R. N. Clarke, "The Measurement of the Properties of Materials," Proceedings of the IEEE, vol. 74, No. 1, Jan. 1986, pp. 183-199.

M.S. Venkatesh and G.S.V. Raghavan, "An overview of dielectric properties measuring techniques," vol. 47, 2005, Canadian Biosystems Engineering, pp. 7.15-7.30.

Andrzej W. Kraszewski, Stuart O. Nelson, and Tian-Su You, "Use of a Microwave Cavity for Sensing Dielectric Properties of Arbitrarily Shaped Biological Objects," IEEE Transactions on Microwave Theory and Techniques. vol. 338, No. 7, Jul. 1990, pp. 858-863.

Leonard Hayden, "A Multi-Line TRL Calibration," Feb. 2. 1994, 5 pages.

Christophe Seguinot, et al., "Multimode TRL—A New concept in Microwave Measurements: Theory and Experimental Verification," IEEE Transactions On Microwave Theory and Techniques, vol. 46, No. 5, May 1998, pp. 536-542.

Robert D. Grober, Robert J. Schoelkopf, and Daniel E. Prober, "Optical antenna: towards a unity efficiency near-field optical probe," Appl. Phys. Lett. 70 (11), Mar. 17, 1997, 1997 American Insitute of Physics, pp. 1354-1356.

Cascade Microtech, "Probe Heads Care and cleaning of coaxial input microwave probes," Microwave Probe Care and Cleaning, Instruction Manual, Copyright 1990.

Bob Stengel, "Neutralized Differential Amplifiers using Mixed-Mode s-parameters," 2003 IEEE Radio Frequency Integrated Circuits Symposium, pp. 711-714.

* cited by examiner

TEST STRUCTURE AND PROBE FOR DIFFERENTIAL SIGNALS

CROSS-REFERENCE TO RELATED APPLICATIONS

This application is a continuation of U.S. patent application Ser. No. 11/710,149, filed Feb. 22, 2007, now U.S. Pat. No. 7,403,028, which claims the benefit of U.S. Provisional App. No. 60/813,120, filed Jun. 12, 2006.

BACKGROUND OF THE INVENTION

The present invention relates to wafer probing and, more particularly, to probes and test structures for wafer probing with differential signals.

Integrated circuits (ICs) are economically attractive because large numbers of often complex circuits, for example microprocessors, can be inexpensively fabricated on the surface of a wafer or substrate. Following fabrication, individual dies, including one or more circuits, are separated or singulated and encased in a package that provides for electrical connections between the exterior of the package and the circuit on the enclosed die. The separation and packaging of a die comprises a significant portion of the cost of manufacturing the integrated circuit device and to monitor and control the IC fabrication process and avoid the cost of packaging defective dies, manufacturers commonly add electrical circuits or test structures to the wafer to enable on-wafer testing or "probing" to verify the characteristics of the integrated circuits before the dies are singulated.

A test structure typically includes a device-under-test (DUT), a plurality of metallic probe or bond pads that are deposited at the wafer's surface and a plurality of conductive vias that connect the bond pads to the DUT which is typically fabricated beneath the surface of the wafer. The DUT typically comprises a simple circuit that includes a copy of one or more of the basic elements of the integrated circuit, such as a single line of conducting material, a chain of vias or a single transistor. The circuit elements of the DUT are typically produced with the same process and in the same layers of the die as the corresponding elements of the integrated circuit. The ICs are typically characterized "on-wafer" by applying a test instrument generated signal to the test structure and measuring the response of the test structure to the signal. Since the circuit elements of the DUT are fabricated with the same process as the corresponding elements of the integrated circuit, the electrical properties of the DUT are expected to be representative of the electrical properties of the corresponding components of the integrated circuit.

At higher frequencies, on-wafer characterization is commonly performed with a network analyzer. The network analyzer comprises a source of an AC signal, commonly, a radio frequency (RF) signal, that is used to stimulate the DUT of a test structure. A forward-reverse switch directs the stimulating signals to one or more of the bond pads of the test structure. Directional couplers or bridges pick off the forward or reverse waves traveling to or from the test structure. These signals are down-converted by intermediate frequency (IF) sections of the network analyzer where the signals are filtered, amplified and digitized for further processing and display. The result is a plurality of s-parameters (scattering parameters), the ratio of a normalized power wave comprising the response of the DUT to a normalized power wave comprising the stimulus supplied by the signal source.

The preferred interconnection for communicating the signals between the signal source and the receiver of the network analyzer and the test structure is coaxial cable. The transition between the coaxial cable and the bond pads of the test structure is preferably provided by a movable probe having one or more conductive probe tips that are arranged to be co-locatable with the bond pads of the test structure. The network analyzer and the test structure can be temporarily interconnected by bringing the probe tips into contact with the bond pads of the test structure.

Integrated circuits typically comprise a ground plane at the lower surface of the substrate on which the active and passive devices of the circuit are fabricated. The terminals of transistors fabricated on a semi-conductive substrate are typically capacitively interconnected, through the substrate, to the ground plane. The impedance of this parasitic capacitive interconnection is frequency dependent and at higher frequencies the ground potential and the true nature of ground referenced (single ended) signals becomes uncertain.

Balanced devices are more tolerant to poor radio frequency (RF) grounding than single ended devices making them attractive for high performance ICs. Referring to FIG. 1, a differential gain cell 20 is a balanced device comprising two nominally identical circuit halves 20A, 20B. When biased, with a DC current source 22, and stimulated with a differential mode signal, comprising even and odd mode components of equal amplitude and opposite phase ($S_i^{+1}$ and $S_i^{-1}$) 24, 26, a virtual ground is established at the symmetrical axis 28 of the two circuit halves. At the virtual ground, the potential at the operating frequency does not change with time regardless of the amplitude of the stimulating signal. The quality of the virtual ground of a balanced device is independent of the physical ground path and, therefore, balanced or differential circuits can tolerate poor RF grounding better than circuits operated with single ended signals. The two waveforms of the differential output signal ($So^{+1}$ and $So^{-1}$) 30, 32 are mutual references providing greater certainty in determining the transition from one binary value to the other and permitting a reduction the voltage swing of the signal and faster transition between binary values. Typically, differential devices can operate at lower signal power and higher data rates than single ended devices. In addition, noise from external sources, such as adjacent conductors, tends to couple, electrically and electromagnetically, in the common mode and cancel in the differential mode. As a result, balanced or differential circuits have good immunity to noise including noise at even-harmonic frequencies since signals that are of opposite phase at the fundamental frequency are in phase at the even harmonics. Improved tolerance to poor RF grounding, increased resistance to noise and reduced signal power make differential devices attractive for operation at higher frequencies.

A DUT comprising a differential gain cell provides a basis for a test structure enabling high frequency, on-wafer evaluation of devices included in the marketable integrated circuits fabricated on the wafer. However, the impedance of the internal connections of the DUT's components are often frequency dependant complicating de-embedding of the DUT and affecting the accuracy of the testing. For example, the input and output of a differential gain cell, such as the differential gain cell 20, are commonly capacitively interconnected as a result of parasitic capacitance connecting the terminals of the cell's transistors. Parasitic capacitance 42 between the gate 38, 40 and the drain 34, 36, a result of diffusion of the drain dopant under the oxide of the gate, is intrinsic and typical of MOS transistors. As a result to the transistor's gain, a change in the gate voltage produces an even larger change in the voltage at the transistor's drain. The application of differing voltages at the terminals of the parasitic gate-to-drain capacitor ($C_{gd}$) causes the capacitor to behave as a much larger capacitance, a phenomenon known as the Miller effect. As a result, input impedance of the differential device varies substantially with frequency, producing instability in the operation of the differential device.

What is desired is a method and apparatus for testing a differential device that minimizes or eliminates the Miller effect.

DETAILED DESCRIPTION OF PREFERRED EMBODIMENTS

Figure 1:
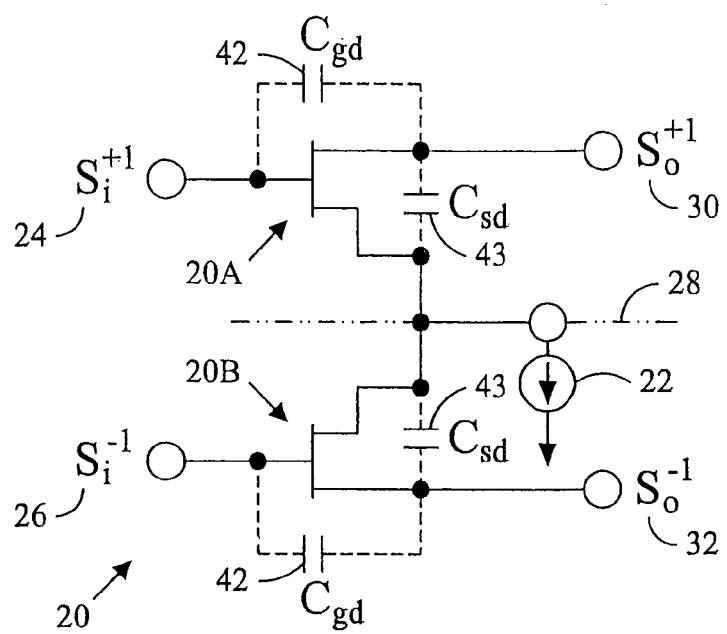
FIG. 1 is schematic diagram of a balanced device.

Referring in detail to the drawings where similar parts are identified by like reference numerals, and, more particularly to FIG. 1, a differential gain cell 20 is a balanced device comprising two nominally identical circuit halves 20A, 20B. When biased, with a DC current source 22, and stimulated with a differential mode signal, comprising even and odd mode components of equal amplitude and opposite phase ($S_i^{+1}$ and $S_i^{-1}$) 24, 26, a virtual ground is established at the symmetrical axis 28 of the two circuit halves. At the virtual ground, the potential at the operating frequency does not change with time regardless of the amplitude of the stimulating signal. The quality of the virtual ground of a balanced device is independent of the physical ground path and, therefore, balanced or differential circuits can tolerate poor RF grounding better than circuits operated with single ended (ground referenced) signals. Differential devices can also typically operate with lower signal power and at higher data rates than single ended devices and have good immunity to noise from external sources, such as adjacent conductors, including noise at even-harmonic frequencies.

However, the response of integrated circuits, including test structures comprising differential gain cells, to high frequency signals is typically frequency dependent. Integrated circuits are fabricated by depositing layers of semi-conductive and insulating materials on a semi-conductive substrate and intrinsic frequency dependent connections commonly exist between the various elements of the fabricated devices. One such intrinsic frequency dependent connection connects the gates and drains of MOS transistors and the bases and collectors of bipolar junction (BJT) transistors. For example, an intrinsic parasitic capacitance ($C_{gd}$) interconnects the gate and the drain of a typical MOS transistor because the drain dopant diffuses under the oxide comprising the transistor's gate. As the frequency of the stimulating signal increases, the impedance between gate and drain of the transistor and, therefore, the input impedance of the differential gain cell changes. Moreover, due to the gain of the transistor, any change in voltage at the gate of the transistor is amplified at the drain of the transistor causing the parasitic capacitance ($C_{gd}$) to appear to be a much larger capacitor; a phenomenon known as the Miller effect. The inventors realized that the signals conducted by the respective transistors of the differential gain cell are mirror images and concluded that the Miller effect could be minimized or eliminated and the input impedance of a test structure comprising a differential gain cell stabilized connecting the gate of one transistor to the drain of the second transistor with a capacitor having a value equal to the parasitic gate-to-drain capacitance ($C_{gd}$).

Figure 2:
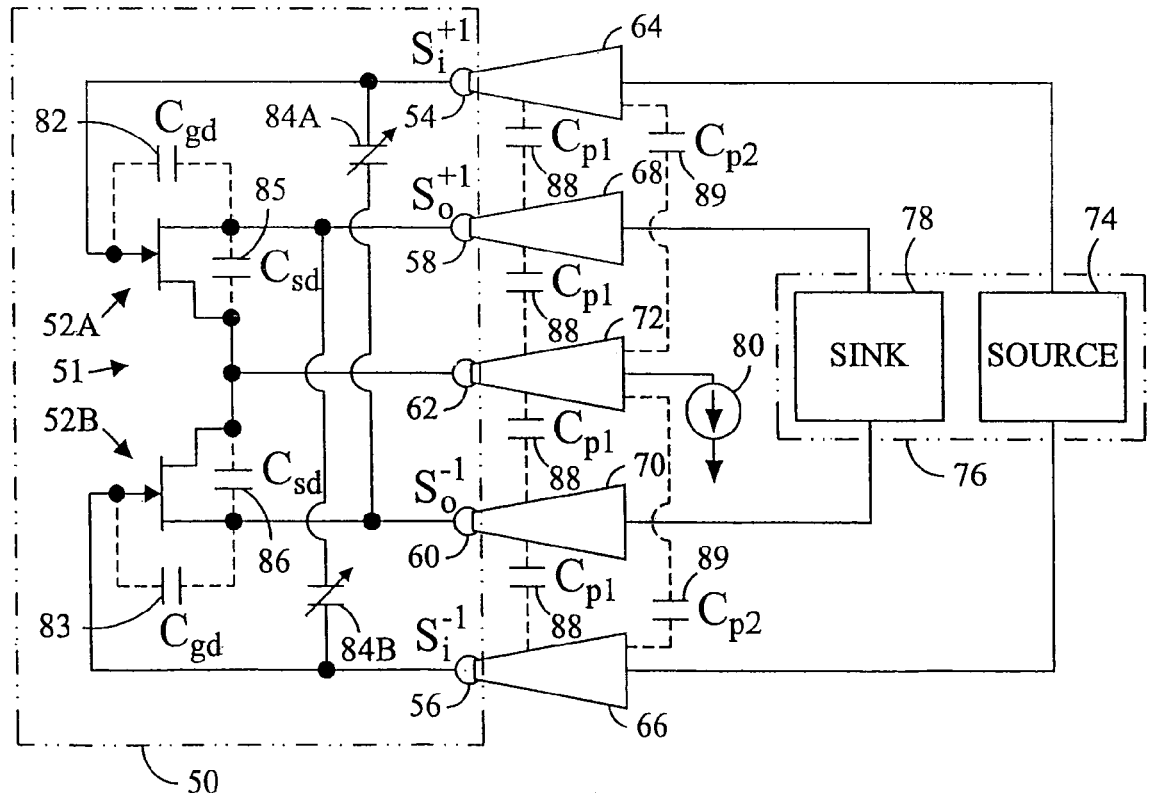
FIG. 2 is a schematic illustration of a probe and a differential test structure comprising field effect transistors and a pair of Miller effect neutralizing capacitors.

Referring to FIG. 2, a test structure 50 comprises a differential gain cell 51 including transistors 52A, 52B. The gates of the respective transistors are connected to probe pads 54, 56 Probe tips 64, 66 arranged to be co-locatable with the probe pads are connected to a source 74 of a differential input signal comprising the component signal, $S_i^{+1}$, and its differential complement signal, $S_i^{-1}$. The source of the differential signal is typically a radio frequency (RF) source included in a network analyzer 76. The network analyzer also includes a sink 78 for the output signal of the test structure comprising components $S_o^{+1}$ and $S_o^{-1}$. The respective components of the output signal are transmitted from the drains of the transistors to probe pads 58, 60 which are connectible to the signal sink through probe tips 68, 70. The sources of the transistors are interconnected and connected to a bias probe pad 62 which is engageable with a probe tip 72. The probe tip is interconnected to a DC current source 80 that provides the bias for the differential gain cell.

Intrinsic in each transistor 52A, 52B is parasitic capacitance ($C_{gd}$) 82A, 82B interconnecting the respective gates and drains which comprise respectively the input terminals and the output terminals of the test structure. As a result of the gain (A) of the transistor, a change in voltage (dV) at the gate of a transistor is amplified at the drain (A*dV) causing the opposing sides of the parasitic capacitance to experience differing voltage. As a result of a phenomenon known as the Miller effect, the parasitic capacitance ($C_{gd}$) has the effect of a larger capacitor causing the input impedance of the test structure to vary substantially with frequency. To reduce or eliminate the effect of the parasitic gate-to-drain capacitance and provide a more constant input impedance for the test structure, a compensating capacitor 84A, 84B is connected from the gate of each transistor, for example the gate of transistor 52A, to the drain of the second transistor of the differential gain cell, for example the drain of transistor 52B. The compensating capacitor has a value equal to the value of $C_{gd}$. Since the transistors of the differential gain cell are matched and the phase of the differential input signal component $S_i^{+1}$ is 180° from the phase of the differential output signal component $S_o^{-1}$, the change in voltage at the drain of a transistor due to the gate-to-drain capacitance, for example, A*dV, is offset by the voltage at the compensating capacitor # (−A*dV) and the input impedance of the test structure remains constant.

Figure 3:
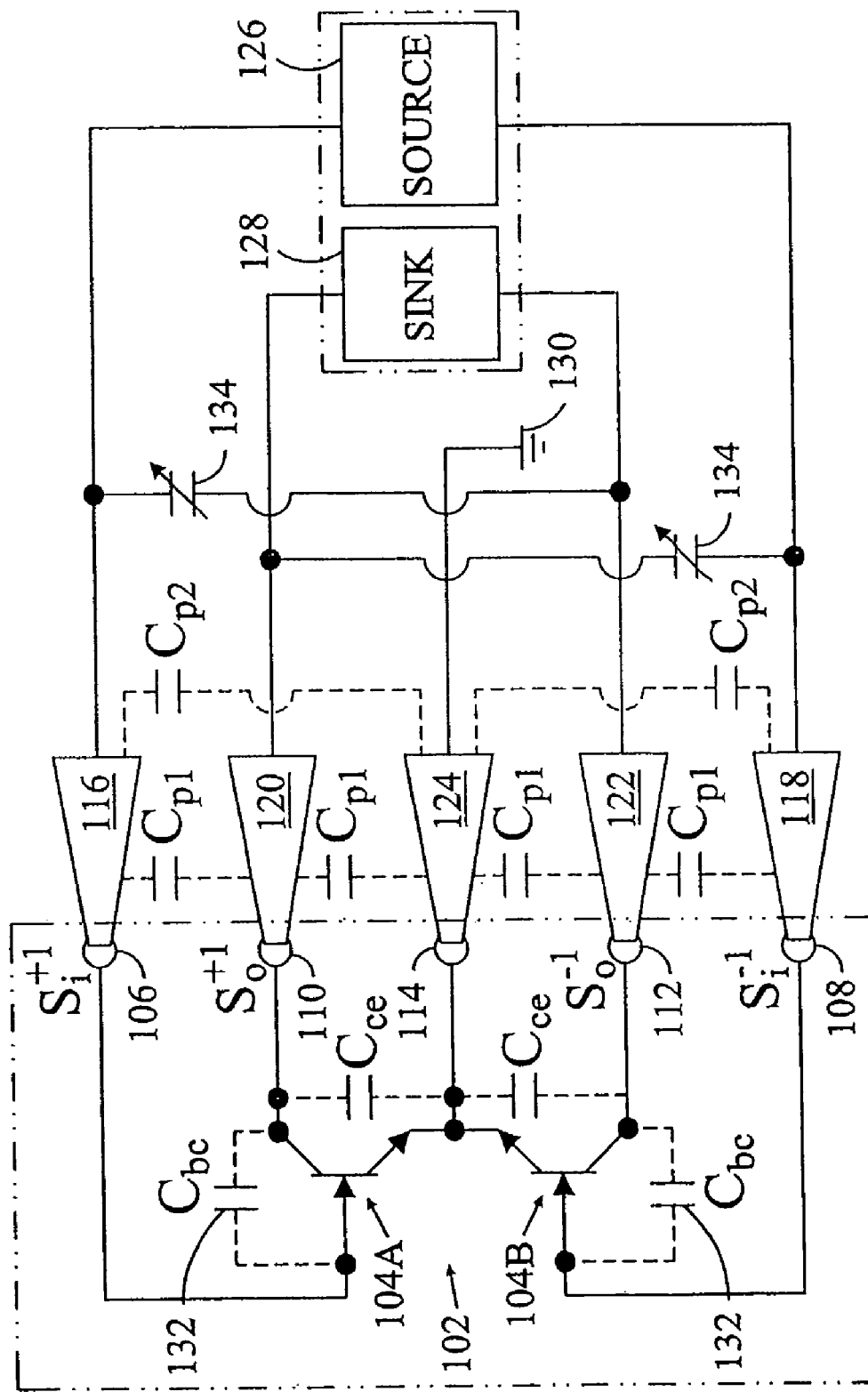
FIG. 3 is a schematic illustration of a probe and a differential test structure comprising bipolar junction (BJT) transistors and a pair of Miller effect neutralizing capacitors.

Referring to FIG. 3, another exemplary embodiment of a test structure 100 comprises a differential gain cell 102 comprising bipolar junction (BJT) transistors 104A, 104B connected in a common emitter configuration. The bases of the transistors are connected to probe pads 106, 108 that are engageable by probe tips 106, 108 interconnected to a source 126 of a differential signal comprising the component input signals ($S_i^{+1}$ and $S_i^{-1}$). The collectors of the transistors are connected to probe pads 110, 112 which are engageable by probe tips 120, 122 which are interconnected to a sink 128 for the output signal of the differential cell comprising the component signals ($S_o^{+1}$ and $S_o^{-1}$). The emitters of the matched transistors are interconnected and connected through a probe tip 124, contactable with a bias probe pad 114, to a DC current source 130 that biases the differential gain cell. Each BJT includes parasitic base-to-collector capacitance ($C_{bc}$) 132 that comprises a frequency dependent interconnection between an input and an output of the test structure. To counter the Miller effect, a compensating capacitor 134 having a value equal to $C_{bc}$ interconnects the gate of each of the transistors 104A, 104B respectively to the collector of the other transistor of the differential gain cell.

Figure 4:
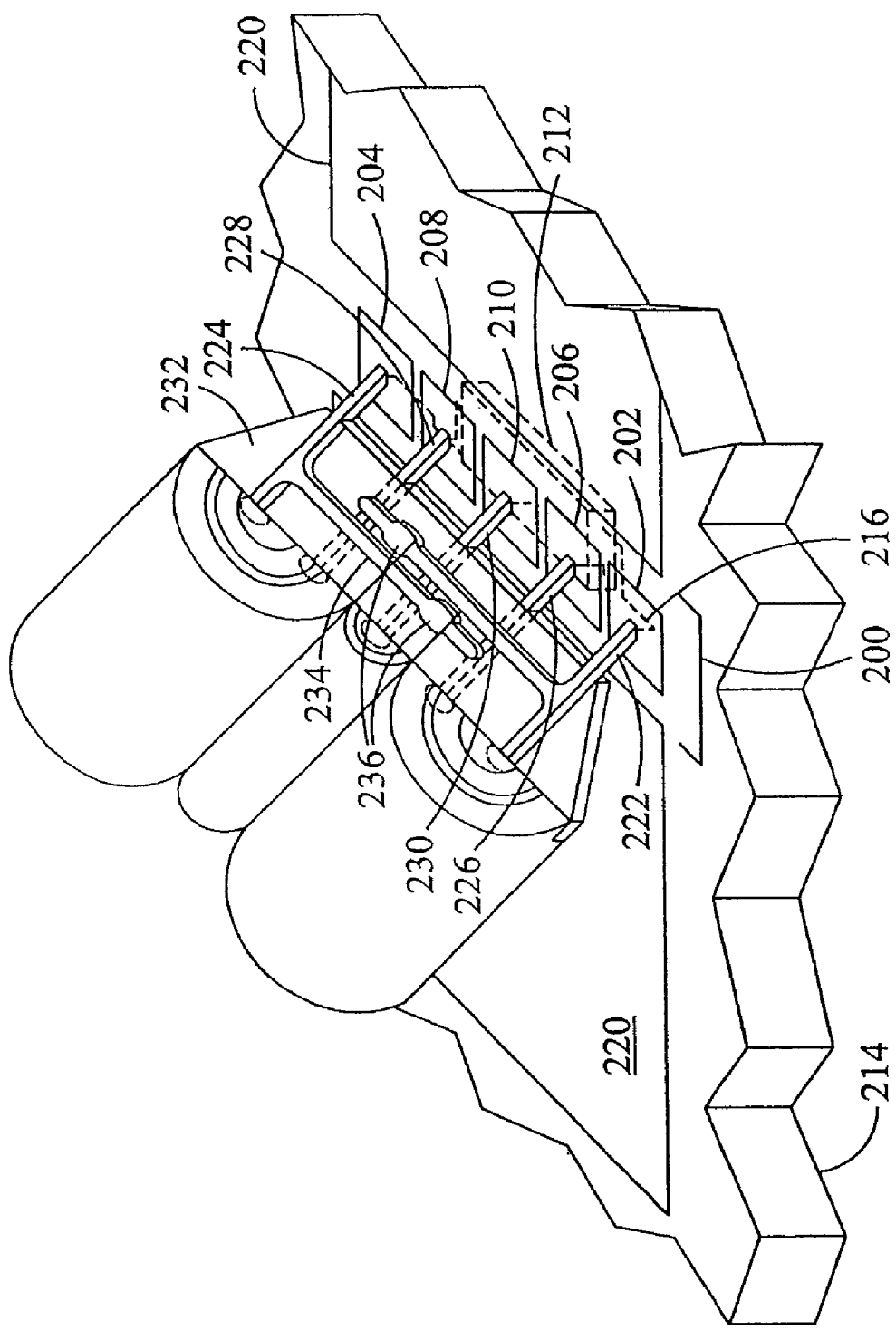
FIG. 4 is a perspective view of a test structure and a probe.
Figure 5:
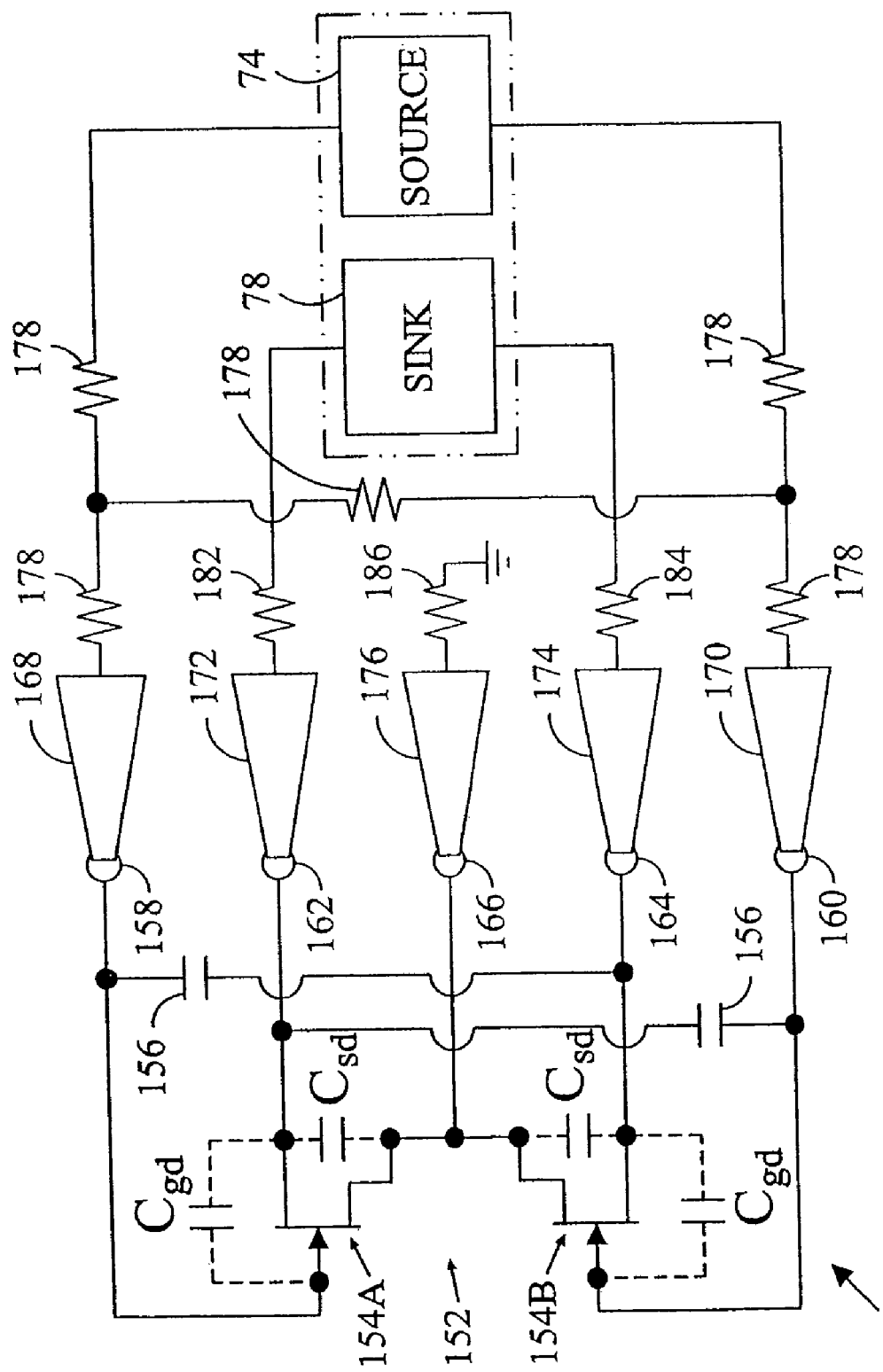
FIG. 5 is a schematic illustration of a differential test structure for go-no go testing of the functionality of a transistor.

The compensating capacitors may be fabricated on the wafer as part of the test structure enabling consistent matching to the parasitic capacitance of the transistors. On the other hand, the compensating capacitors may be connected across the respective probe tips arranged to engage the appropriate probe pads. Typically, differential probing is performed with two probes. Referring to FIG. 4, the differential test structure 200 comprises at least four bond or probe pads, including probe pads 202, 204 for the input signal components and probe pads 206, 208 for the output signal components that are arranged in a linear array and connected to the DUT 212, which is fabricated below the surface of a wafer 214, by a plurality of conductive vias 216. The fifth probe pad 210, through which the DUT is biased, is preferably fabricated within the linear array but could be offset. Arrangement of the probe pads in a linear array enables fabrication of the test structure in a saw street 218 (indicated by bracket) between dies 220 permitting a reduction in the area of the wafer that is occupied by test structures which serve no purpose after the dies are singulated. The linear arrangement of probe pads also enables probing with a single probe comprising a linear array of at least four probe tips 222, 224, 226, 228 which may be fabricated on the surfaces of a dielectric plate 232 and which are arranged to be co-locatable with the probe pads for the input and output signals. The fifth probe tip 230, through which the DUT is biased, is preferably fabricated in the linear array probe tips but could be offset or arranged at a different angle to the wafer. The linear arrangement of probe tips facilitates fabrication of conductors 234 and compensating capacitors 236 interconnecting the probe tips 222, 224 transmitting the input signals and the probe tips 226, 228 transmitting the output signals for the two transistors of the differential gain cell of the DUT.

During the fabrication of integrated circuits (ICs) it is desirable to be able to easily determine if transistors included in the integrated circuits are functional. Referring to FIG. 4, an easily tested go-no go test structure 150 comprising a differential gain cell 152 having circuit elements fabricated with the same process and in the same layers of the wafer as their counterpart elements of the marketable integrated circuits. The test structure comprises compensating capacitors 156 connecting the gate of each transistor 154A, 154B to the drain of its counterpart, respectively 154B, 154A, to neutralize the Miller effect originating with the parasitic gate-to-drain capacitance ($C_{gd}$) and stabilize the input impedance of the test structure. A resistor network comprising resistors 178 connect the signal input probe tips 168, 170, arranged to engage the input probe pads 158, 160, and the signal source 74. Likewise, the signal output probe pads 162, 164 are connected to the signal sink 78 through probe tips 172, 174 and resistors 182, 184. The test structure is biased through the probe pad 166 and the probe tip 176 which is connected to ground through the bias resistor 186. The resistors at all terminations stabilize the DC operation of the amplifier and prevent it from oscillating by reducing the Q factor of resonances produced by the capacitive and inductive interconnections of the device parasitics. The values of the resistors are selected to provide stability and a convenient level of gain, preferably, approximately unity. Data is collected by testing a plurality transistor pairs known to be good. Comparing this data to data obtained by testing on-wafer test structures provides a go-no go gauge of transistor functionality that can be easily used during the production process.

The input impedance of a test structure comprising a differential gain cell is stabilized by interconnecting the gate of one transistor and the drain of the second transistor of the differential pair with a capacitor having a value approximating the parasitic gate-to-drain (base-to-collector) capacitance of the device.

The detailed description, above, sets forth numerous specific details to provide a thorough understanding of the present invention. However, those skilled in the art will appreciate that the present invention may be practiced without these specific details. In other instances, well known methods, procedures, components, and circuitry have not been described in detail to avoid obscuring the present invention.

All the references cited herein are incorporated by reference.

The terms and expressions that have been employed in the foregoing specification are used as terms of description and not of limitation, and there is no intention, in the use of such terms and expressions, of excluding equivalents of the features shown and described or portions thereof, it being recognized that the scope of the invention is defined and limited only by the claims that follow.

I claim:

1. A test structure comprising a cell including a first in put signal probe pad capacitively interconnected to a first output signal probe pad and a second input signal probe pad capacitively interconnected to a second output signal probe pad, said test structure comprising:
   (a) a first capacitor interconnecting said first input signal probe pad and said second output signal probe pad; and
   (b) a second capacitor interconnecting said second input signal probe pad and said first output signal probe pad; wherein
   said first capacitor has a capacitance substantially equal to a capacitance of said interconnection of said first input signal probe pad and said first output signal probe pad and said second capacitor has a capacitance substantially equal to a capacitance of said interconnection of said second input signal probe pad and said second output signal probe pad.

2. A probe for probing a cell comprising a first input signal probe pad capacitively interconnected to a first output signal probe pad and a second input signal probe pad capacitively interconnect to a second output signal probe pad, said probe comprising:
   (a) a first probe tip connectible to a source of a first input signal and arranged for contact with said first input signal probe pad of said cell;
   (b) a second probe tip connectible to a source of a second input signal and arranged for contact with said second input signal probe pad;
   (c) a third probe tip connectible to a sink of a first output signal and arranged for contact with said first output signal probe pad;
   (d) a fourth probe tip connectible to a sink of a second output signal and arranged to contact said second output signal probe pad;
   (e) a first capacitor interconnecting said first probe tip and said fourth probe tip; and
   (f) a second capacitor interconnecting said second probe tip and said third probe tip.

3. The probe of claim 2 wherein said first, said second, said third and said fourth probe tips are arranged in a linear array.

4. The probe of claim 2 wherein said capacitor interconnecting said first probe tip and said fourth probe tip has a capacitance substantially equal to a capacitance of said interconnection of said first input signal probe pad and said first output signal probe pad and said capacitor interconnecting said second probe tip and said third probe tip has a capacitance substantially equal to a capacitance of said interconnection of said second input signal probe pad and said second output signal probe pad.

5. The probe of claim 4 wherein said first, said second, said third and said fourth probe tips are arranged in a linear array.

6. A test structure for testing a functionality of a transistor, said test structure comprising:
 (a) a first transistor including:
  (i) a first terminal connectible through a first resistance to a source of a first component of a signal;
  (ii) a second terminal connectible through a second resistance to a sink for a first component of an output signal and interconnected to said first terminal by a parasitic capacitance; and
  (iii) a third terminal;
 (b) a second transistor including:
  (i) a first terminal connectible through a third resistance to a source of a second component of a signal;
  (ii) a second terminal connectible through a fourth resistance to a sink for a second component of an output signal and interconnected to said first terminal by a parasitic capacitance; and
  (iii) a third terminal interconnected with said third terminal of said first transistor and a source of a bias voltage;
 (c) a first compensating capacitor connecting said first terminal of said first transistor to said second terminal of said second transistor; and
 (d) a second compensating capacitor connecting said first terminal of said second transistor to said second terminal of said first transistor.

7. The test structure of claim 6 wherein said first compensating capacitor has a capacitance substantially equal to said parasitic capacitance interconnecting said first terminal of said first transistor and said second terminal of said first transistor and said second compensating capacitor has a capacitance substantially equal to said parasitic capacitance interconnecting said first terminal of said second transistor to said second terminal of said second transistor.

8. The test structure of claim 6 wherein said first, said second, said third and said fourth resistances have values selected to cause said test structure to have a gain approximating unity.

* * * * *